United States Patent
Takado et al.

(10) Patent No.: US 9,444,225 B2
(45) Date of Patent: Sep. 13, 2016

(54) SEMICONDUCTOR LASER DEVICE

(71) Applicant: ROHM CO., LTD., Kyoto (JP)

(72) Inventors: Shinya Takado, Kyoto (JP); Junichi Kashiwagi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/519,088

(22) Filed: Oct. 20, 2014

(65) Prior Publication Data
US 2015/0036709 A1 Feb. 5, 2015

Related U.S. Application Data

(63) Continuation of application No. 13/548,745, filed on Jul. 13, 2012, now Pat. No. 8,885,681.

(30) Foreign Application Priority Data

Jul. 14, 2011 (JP) .................................. 2011-155942
Jun. 21, 2012 (JP) .................................. 2012-139876

(51) Int. Cl.
| | |
|---|---|
| *H01S 5/34* | (2006.01) |
| *H01S 5/343* | (2006.01) |
| *H01S 5/32* | (2006.01) |
| *B82Y 20/00* | (2011.01) |
| *H01S 5/20* | (2006.01) |
| *H01S 5/00* | (2006.01) |
| *H01S 5/02* | (2006.01) |

(Continued)

(52) U.S. Cl.
CPC ............ *H01S 5/34333* (2013.01); *B82Y 20/00* (2013.01); *H01S 5/0425* (2013.01); *H01S 5/3213* (2013.01); *H01S 5/3216* (2013.01); *H01S 5/0014* (2013.01); *H01S 5/0202* (2013.01); *H01S 5/0421* (2013.01); *H01S 5/2009* (2013.01); *H01S 5/2031* (2013.01); *H01S 5/2214* (2013.01); *H01S 5/2231* (2013.01); *H01S 5/3063* (2013.01)

(58) Field of Classification Search
CPC .. H01S 5/2031; H01S 5/2214; H01S 5/2231; H01S 5/3216; H01S 5/34333; H01S 5/0425
See application file for complete search history.

(56) References Cited

U.S. PATENT DOCUMENTS 4,297,652 A * 10/1981 Hayashi et al. ........... 372/50.23
6,327,413 B1 * 12/2001 Kinoshita ..................... 385/129
(Continued)

FOREIGN PATENT DOCUMENTS

| JP | 2000-232236 A | 8/2000 |
|---|---|---|
| JP | 2009-094360 A | 4/2009 |

*Primary Examiner* — Yuanda Zhang
*Assistant Examiner* — Michael Carter
(74) *Attorney, Agent, or Firm* — Rabin & Berdo, P.C.

(57) ABSTRACT

A semiconductor laser device generates blue-violet light with an emission wavelength of 400 to 410 nm. The device includes an n-type group III nitride semiconductor layer, an active layer laminated on the n-type semiconductor layer and having an InGaN quantum well layer, a p-type group III nitride semiconductor layer laminated on the active layer, and a transparent electrode contacting the p-type semiconductor layer and serving as a clad. The n-type semiconductor layer includes an n-type clad layer and an n-type guide layer disposed between the clad layer and the active layer. The guide layer includes a superlattice layer in which an InGaN layer and an $Al_xGa_{1-x}N$ layer ($0 \le X < 1$) are laminated periodically, the superlattice layer contacting the active layer and having an average refractive index of 2.6 or lower. The In composition of the InGaN layer is lower than that of the InGaN quantum well layer.

22 Claims, 15 Drawing Sheets

(51) Int. Cl.
    *H01S 5/042*     (2006.01)
    *H01S 5/22*      (2006.01)
    *H01S 5/223*     (2006.01)
    *H01S 5/30*      (2006.01)

(56) References Cited

U.S. PATENT DOCUMENTS

| | | |
|---|---|---|
| 6,900,465 B2 * | 5/2005 | Nakamura et al. ............. 257/79 |
| 7,193,246 B1 | 3/2007 | Tanizawa et al. |
| 7,826,512 B2 * | 11/2010 | Ueda et al. .................... 372/87 |
| 2001/0030318 A1 | 10/2001 | Nakamura et al. |
| 2005/0224783 A1 * | 10/2005 | Matsuyama et al. ........... 257/14 |
| 2006/0203867 A1 * | 9/2006 | Imai ........................ 372/43.01 |
| 2007/0063207 A1 | 3/2007 | Tanizawa et al. |
| 2007/0098030 A1 * | 5/2007 | Ha ........................ B82Y 20/00 |
| | | 372/43.01 |
| 2008/0191195 A1 | 8/2008 | Tanizawa et al. |
| 2009/0020780 A1 * | 1/2009 | Lee et al. ..................... 257/101 |
| 2010/0154885 A1 * | 6/2010 | Yang ........................... 136/256 |
| 2010/0195687 A1 * | 8/2010 | Okamoto et al. ........ 372/45.012 |

* cited by examiner

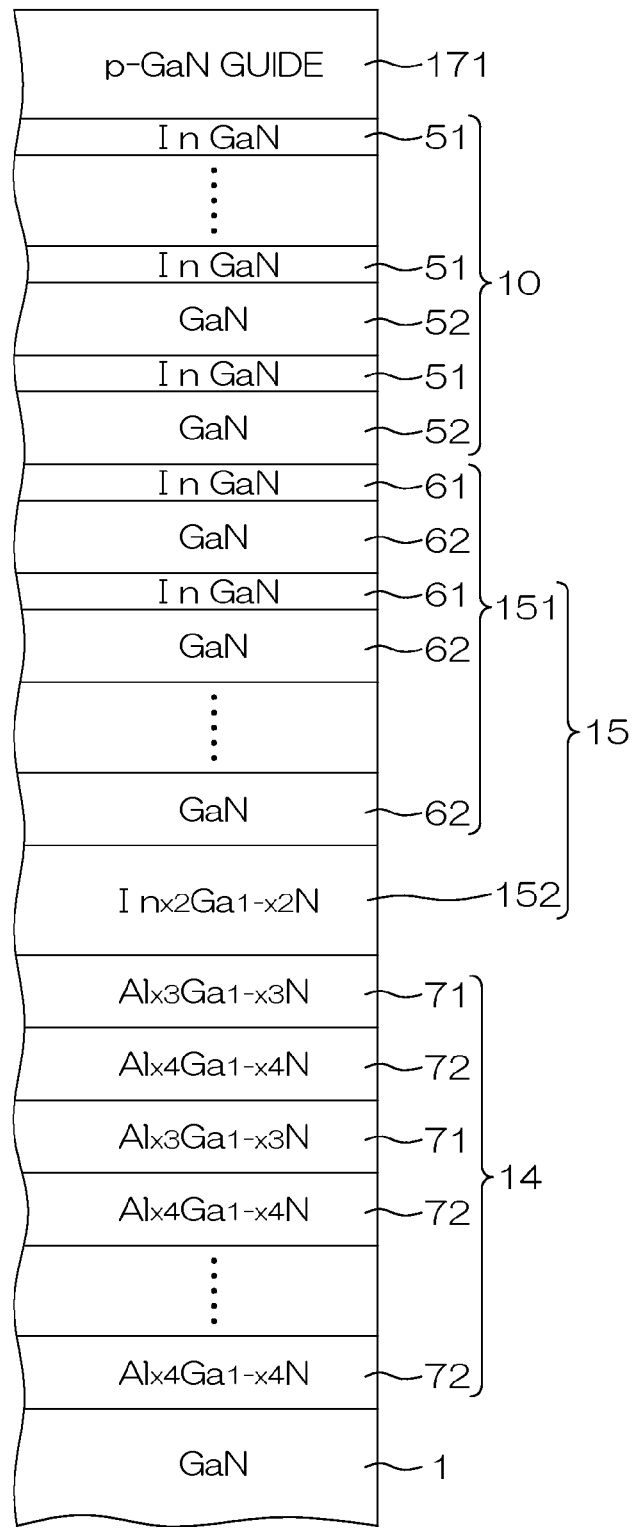

FIG. 15

| | Al COMPOSITION OF THE AlGaN LAYER 0% | Al COMPOSITION OF THE AlGaN LAYER 1% | Al COMPOSITION OF THE AlGaN LAYER 2% | Al COMPOSITION OF THE AlGaN LAYER 3% |
|---|---|---|---|---|
| FILM THICKNESS OF THE InGaN LAYER [Å] | 10 | 15 | 18 | 21 |
| FILM THICKNESS OF THE AlGaN LAYER [Å] | 30 | 25 | 22 | 19 |

SEMICONDUCTOR LASER DEVICE

CROSS-REFERENCE TO RELATED APPLICATION(S)

This is a continuation of co-pending U.S. application Ser. No. 13/548,745, filed Jul. 13, 2012, which claims priority under 35 U.S.C. §119 of Japanese Patent Application No. 2011-155942, filed on Jul. 14, 2011, and 2012-139876, filed on Jun. 21, 2012, the entire contents of which are hereby incorporated by reference.

BACKGROUND OF THE INVENTION

1. Field of the Invention

The present invention relates to a semiconductor laser device.

2. Description of Related Art

Japanese Unexamined Patent Application Publication No. 2009-94360 discloses a semiconductor laser device according to a related art. The semiconductor laser device includes a substrate and a group III nitride semiconductor laminate structure formed on the substrate. The group III nitride semiconductor laminate structure is arranged by laminating an n-type semiconductor layer, a light emitting layer, and a p-type semiconductor layer. The n-type semiconductor layer includes an n-type AlGaN clad layer and an n-type GaN (or InGaN) guide layer, while the p-type semiconductor layer includes a p-type AlGaN electron blocking layer and a p-type GaN (or InGaN) guide/GaN contact layer. A p-type transparent electrode made of ZnO is in ohmic contact with the surface of the p-type GaN (or InGaN) guide/GaN contact layer. The p-type electrode is used also as an upper clad layer.

SUMMARY OF THE INVENTION

A first aspect of the present invention is directed to a semiconductor laser device for generating blue-violet light with an emission wavelength of 400 nm to 410 nm, including: an n-type group III nitride semiconductor layer; an active layer laminated on the n-type group III nitride semiconductor layer and having an InGaN quantum well layer; a p-type group III nitride semiconductor layer laminated on the active layer; and a transparent electrode in contact with the p-type group III nitride semiconductor layer, the electrode serving as a clad. The n-type group III nitride semiconductor layer includes an n-type clad layer and an n-type guide layer disposed between the n-type clad layer and the active layer. The n-type guide layer includes a superlattice layer in which an InGaN layer and an $Al_xGa_{1-x}N$ layer ($0 \leq X < 1$) are laminated periodically, the superlattice layer having an average refractive index of 2.6 or lower. The In composition of the InGaN layer is lower than the In composition of the InGaN quantum well layer. The superlattice layer is in contact with the active layer.

In accordance with this arrangement, holes are injected from the transparent electrode via the p-type group III nitride semiconductor layer into the active layer, while electrons are injected from the n-type group III nitride semiconductor layer into the active layer. Recombination of these holes and electrons generates and emits blue-violet light with a wavelength of 400 nm to 410 nm. The light is confined between the transparent electrode serving as a clad and the n-type clad layer, and then propagates in a direction perpendicular to the direction of lamination of the nitride semiconductor laminate structure including the n-type group III nitride semiconductor layer, active layer, and p-type group III nitride semiconductor layer. The light then undergoes stimulated emissions repeatedly between resonator end surfaces arranged at both ends in the direction of propagation to be resonantly amplified and partially emitted through the resonator end surfaces as a laser beam.

The transparent electrode contains one or two or more of, for example, indium oxide-based materials, zinc oxide-based materials, gallium oxide-based materials, and tin oxide-based materials. The transparent electrode, which is composed of such materials, has a lower refractive index relative to group III nitride semiconductors. For this reason, the light confinement structure constituted by the n-type group III nitride semiconductor clad layer and the transparent electrode makes the light emission peak (electric field strength peak) more likely to shift to the n-type semiconductor layer rather than to the active layer. In particular, the InGaN quantum well layer included in the active layer is required to have a low In composition (e.g. approximately 6%) to generate blue-violet light with a wavelength of 400 nm to 410 nm. This makes it impossible to increase the refractive index of the active layer and thereby difficult to fit the light emission peak to the active layer. It is thus difficult to achieve a semiconductor laser device having adequate characteristics (e.g. sufficiently low threshold value). It is considered that this problem can be solved by reducing the refractive index of the n-type group III nitride semiconductor clad layer. More specifically, it suffices to compose the n-type clad layer of an AlGaN layer with a high Al composition. However, the Al composition is required to increase to 20% to balance the refractive index of the AlGaN layer and the refractive index of the transparent electrode. The AlGaN layer with such a high Al composition inevitably has a high electric resistance. Additionally, in the case of forming such a nitride semiconductor laminate structure on a GaN substrate, for example, since the AlGaN layer with a high Al composition (e.g. of 20%) has a large lattice mismatch with GaN, a crack may occur in the nitride semiconductor laminate structure to result in a reduced yield.

Hence, in the present invention, the n-type guide layer includes a superlattice layer in which an InGaN layer and an $Al_xGa_{1-x}N$ layer ($0 \leq X < 1$) are laminated periodically, and the superlattice layer has an average refractive index of 2.6 or lower. More specifically, the In composition and film thickness of the InGaN layer and the Al composition X and film thickness of the $Al_xGa_{1-x}N$ layer ($0 \leq X < 1$) are designed so that the superlattice layer has an average refractive index of 2.6 or lower. The thus arranged superlattice layer is then disposed in contact with the active layer. This allows the refractive index of p- and n-types on either side of the active layer to be balanced for blue-violet light with a wavelength of 400 nm to 410 nm and thereby the light emission peak to be fitted to the active layer, whereby it is possible to provide a semiconductor laser device having adequate characteristics (especially, sufficiently low threshold value). In addition, the average refractive index is given by the following formula using the refractive index $n_{InGaN}$ and film thickness $T_{InGaN}$ of the InGaN layer and the refractive index $n_{AlGaN}$ (equal to the refractive index $n_{GaN}$ of GaN if X=0) and film thickness $T_{AlGaN}$ of the $Al_xGa_{1-x}N$ layer ($0 \leq X < 1$). In this formula, the denominator represents layer thickness per period (periodic thickness) and the numerator represents optical film thickness per period.

$$\text{Average refractive index} = \frac{n_{InGaN} \times T_{InGaN} + n_{AlGaN} \times T_{AlGaN}}{T_{InGaN} + T_{AlGaN}}$$

Although the n-type guide layer can be composed of a single InGaN film, such a single InGaN film formed on, for example, a GaN substrate is likely to undergo threading dislocation from the GaN substrate, which may cause current leakage. Hence, in the present invention, the n-type guide layer includes a superlattice layer composed of an InGaN layer and an $Al_xGa_{1-x}N$ layer ($0 \leq X < 1$). This can suppress or prevent current leakage due to threading dislocation.

The InGaN layer included in the superlattice layer in the n-type guide layer, if having a high In composition, may have a refractive index higher than that of the active layer. In addition, carriers are less likely to be confined in the active layer. Therefore, the In composition of the InGaN layer included in the superlattice layer is made lower than the In composition of the InGaN quantum well layer in the active layer.

The n-type guide layer preferably has an optical film thickness of 1000 Å or more but 4000 Å or less. The optical film thickness is given by the product of the physical film thickness (absolute film thickness) and the refractive index of the film material. Therefore, the optical film thickness of the superlattice layer is given by the following formula using the number N of repetitive periods in the superlattice layer (i.e. the number of pairs of InGaN layer and $Al_xGa_{1-x}N$ layer ($0 \leq X < 1$)).

Optical film thickness=$(n_{InGaN} \cdot T_{InGaN} + n_{AlGaN} \cdot T_{AlGaN}) \times N$ The smaller the optical film thickness of the n-type guide layer is, the lower the threshold value becomes, but no emission may occur if the thickness is less than 1000 Å. On the other hand, if the n-type guide layer has an optical film thickness of more than 4000 Å, the rate of increase in the threshold value may become greater relative to the increase in the optical film thickness, resulting in deterioration in characteristics.

In the active layer, from which blue-violet light with a wavelength of 400 nm to 410 nm is generated, the InGaN quantum well layer has an In composition of 6% or higher. Hence, the InGaN layer included in the superlattice layer preferably has an In composition of 6% or lower so that the active layer has the highest refractive index whereby the light emission peak is fitted to the active layer and carriers are confined satisfactorily in the active layer. The InGaN layer included in the superlattice layer may also have an In composition of 4% or lower to allow the superlattice layer to have an average refractive index of 2.6 or lower. Reducing the In composition of the InGaN layer in the superlattice layer to 4% or lower allows light and carriers to be confined more satisfactorily in the active layer.

The Al composition X of the $Al_xGa_{1-x}N$ layer included in the superlattice layer may be zero. That is, an InGaN layer and a GaN layer may be laminated periodically in the superlattice layer.

The $Al_xGa_{1-x}N$ layer included in the superlattice layer may also have an Al composition X of $0 < X \leq 0.04$. The refractive index of $Al_xGa_{1-x}N$ (X>0) is lower than the refractive index of GaN and becomes lower as the Al composition increases. Therefore, using the $Al_xGa_{1-x}N$ layer (X>0) allows the average refractive index of the n-type guide layer to be reduced to 2.6 or lower even if the n-type guide layer may have a large physical film thickness (absolute film thickness). That is, the range of the physical film thickness of the n-type guide layer can be widened, so that the degree of freedom of the design increases. For example, the n-type guide layer can have a relatively large physical film thickness while having an optical film thickness of 1000 Å to 4000 Å. This can provide a high-intensity semiconductor laser device by, for example, increasing the physical film thickness of the n-type guide layer to improve the light emission intensity.

Meanwhile, if the Al composition X of the $Al_xGa_{1-x}N$ layer is too high, the n-type guide layer has a refractive index lower than that of the n-type clad layer, which may result in poor light confinement. Therefore, the Al composition X is preferably 0.04 or lower (4% or lower).

The active layer may have a multiple-quantum well structure in which an undoped InGaN or GaN barrier layer (having a thickness of 200 Å or less, for example) and the InGaN quantum well layer are laminated alternately. In this case, the InGaN layer included in the superlattice layer is preferably in contact with the barrier layer.

In accordance with this arrangement above, the InGaN layer included in the superlattice layer is in contact with the barrier layer in the active layer, that is, the superlattice layer is in direct contact with the active layer with no layer therebetween. Since the superlattice layer, which has a low refractive index, is thus disposed in contact with the active layer, the light emission peak can be fitted to the active layer. In the case of forming such a nitride semiconductor laminate structure on a GaN substrate, for example, the superlattice layer starts to be grown from the $Al_xGa_{1-x}N$ layer ($0 \leq X < 1$) from the viewpoint of a lattice match with the GaN substrate. In this case, the last layer (top layer) in the superlattice layer is an InGaN layer to be in contact with the barrier layer in the active layer.

The multiple-quantum well structure may have a superlattice structure in which an InGaN barrier layer with an In composition of 2% to 3% and an InGaN quantum well layer with an In composition of approximately 6% are laminated alternately. Alternatively, the multiple-quantum well structure may have a superlattice structure in which a GaN barrier layer and an InGaN quantum well layer with an In composition of approximately 6% are laminated alternately.

A second aspect of the present invention is directed to a semiconductor laser device for generating blue-violet light with an emission wavelength of 400 nm to 410 nm, including: an n-type group III nitride semiconductor layer; an active layer laminated on the n-type group III nitride semiconductor layer and having an InGaN quantum well layer; a p-type group III nitride semiconductor layer laminated on the active layer; and a transparent electrode in contact with the p-type group III nitride semiconductor layer, the electrode serving as a clad. The p-type group III nitride semiconductor layer includes a p-type AlGaN electron blocking layer having an Al composition of 15% or higher but 25% or lower.

In accordance with this arrangement above, holes are injected from the transparent electrode via the p-type group III nitride semiconductor layer into the active layer, while electrons are injected from the n-type group III nitride semiconductor layer into the active layer. Recombination of these holes and electrons generates and emits blue-violet light with a wavelength of 400 nm to 410 nm. The light is confined between the transparent electrode serving as a clad and the n-type clad layer, and then propagates in a direction perpendicular to the direction of lamination of the nitride semiconductor laminate structure including the n-type group III nitride semiconductor layer, active layer, and p-type group III nitride semiconductor layer. The light then undergoes stimulated emissions repeatedly between resonator end surfaces arranged at both ends in the direction of propagation to be resonantly amplified and partially emitted through the resonator end surfaces as a laser beam.

The transparent electrode contains one or two or more of, for example, indium oxide-based materials, zinc oxide-based materials, gallium oxide-based materials, and tin oxide-based materials. The transparent electrode, which is composed of such materials, has a lower refractive index relative to group III nitride semiconductors. For this reason, the light confinement structure constituted by the n-type group III nitride semiconductor clad layer and the transparent electrode makes the light emission peak (electric field strength peak) more likely to shift to the n-type semiconductor layer rather than to the active layer. In addition, the p-type AlGaN electron blocking layer has a low refractive index to encourage the tendency of the light emission peak to shift to the n-side. In particular, the InGaN quantum well layer included in the active layer is required to have a low In composition (e.g. approximately 6%) to generate blue-violet light with a wavelength of 400 nm to 410 nm. This makes it impossible to increase the refractive index of the active layer and thereby difficult to fit the light emission peak to the active layer. It is thus difficult to achieve a semiconductor laser device having adequate characteristics (e.g. sufficiently low threshold value). It is considered that this problem can be solved by reducing the refractive index of the n-type group III nitride semiconductor clad layer. More specifically, it suffices to compose the n-type clad layer of an AlGaN layer with a high Al composition. However, the Al composition is required to increase to 20% to balance the refractive index of the AlGaN layer and the refractive index of the transparent electrode. The AlGaN layer with such a high Al composition inevitably has a high electric resistance. Additionally, in the case of forming such a nitride semiconductor laminate structure on a GaN substrate, for example, since the AlGaN layer with a high Al composition (e.g. of 20%) has a large lattice mismatch with GaN, a crack may occur in the nitride semiconductor laminate structure to result in a reduced yield.

Hence, in the present invention, the p-type electron blocking layer is composed of an AlGaN layer with an Al composition of 15% to 25%. This can bring the light emission peak closer to the active layer and thereby achieve adequate laser diode characteristics (especially, sufficiently low threshold value). Although lower Al composition is better from the viewpoint of light confinement, an Al composition of lower than 15% cannot sufficiently block electrons from the active layer, which may result in a saturation of the threshold value reduction effect as well as in a reduction in the output power within the high-current region. On the other hand, an Al composition of higher than 25% causes the refractive index of the p-type electron blocking layer to become too low, which may result in poor light confinement in the active layer.

The p-type electron blocking layer preferably has an optical film thickness of 300 Å or less. With this arrangement, the thickness of the electron blocking layer, which has a low refractive index, can be suppressed, whereby the light emission peak can be fitted to the active layer. The optical film thickness is given by the product of the refractive index of the AlGaN layer included in the p-type electron blocking layer and the thickness of the AlGaN layer. If the p-type electron blocking layer is too thin, the effect of blocking electrons from the active layer is reduced. Therefore, the p-type electron blocking layer preferably has a film thickness of 80 Å or more.

The p-type group III nitride semiconductor layer preferably further includes a p-type $Al_{x1}Ga_{1-x1}N$ ($0 \leq X1 < 1$) guide layer disposed between the p-type electron blocking layer and the active layer. The growth temperature (e.g. 1050° C.) of the p-type AlGaN electron blocking layer is higher than the growth temperature (e.g. 850° C.) of the active layer including the InGaN quantum well layer. Therefore, in the process of manufacturing such a semiconductor laser device, the p-type AlGaN electron blocking layer is required to be grown after the growth of the active layer and then the rise in the temperature of the substrate. During this waiting period, the topmost surface (crystal surface) of the active layer is exposed to impurities in the atmosphere, which may cause the crystal surface to be deteriorated. Hence, in the present invention, a p-type $Al_{x1}Ga_{1-x1}N$ ($0 \leq X1 < 1$) guide layer is disposed between the active layer and the p-type electron blocking layer. The crystal growth can occur continuously from the active layer to the p-type electron blocking layer by forming the p-type guide layer during the temperature rise process after the growth of the active layer and continuously forming the p-type AlGaN electron blocking layer. This can prevent the surface of the active layer from being deteriorated and thereby can improve the characteristics (especially, threshold value) of the semiconductor laser device.

In order to increase the electron injection efficiency into the active layer, the p-type electron blocking layer is preferably disposed as close as possible to the active layer. Accordingly, the p-type guide layer preferably has a thickness of 0 to 500 Å.

A third aspect of the present invention is directed to a semiconductor laser device including: an n-type group III nitride semiconductor layer; an active layer laminated on the n-type group III nitride semiconductor layer; a p-type group III nitride semiconductor layer laminated on the active layer; and a transparent electrode in contact with the p-type group III nitride semiconductor layer, the electrode serving as a clad. The n-type group III nitride semiconductor layer includes an n-type clad layer and an n-type guide layer disposed between the n-type clad layer and the active layer. The n-type guide layer includes a first guide layer composed of a superlattice layer in which an InGaN layer and an $Al_xGa_{1-x}N$ layer ($0 \leq X < 1$) are laminated periodically and a second guide layer composed of an $In_{x2}Ga_{1-x2}N$ layer ($0 \leq X2 < 1$) disposed between the first guide layer and the n-type clad layer.

In accordance with this arrangement above, holes are injected from the transparent electrode via the p-type group III nitride semiconductor layer into the active layer, while electrons are injected from the n-type group III nitride semiconductor layer into the active layer. Recombination of these holes and electrons generates and emits light. The light is confined between the transparent electrode serving as a clad and the n-type clad layer, and then propagates in a direction perpendicular to the direction of lamination of the nitride semiconductor laminate structure including the n-type group III nitride semiconductor layer, active layer, and p-type group III nitride semiconductor layer. The light then undergoes stimulated emissions repeatedly between resonator end surfaces arranged at both ends in the direction of propagation to be resonantly amplified and partially emitted through the resonator end surfaces as a laser beam.

The transparent electrode contains one or two or more of, for example, indium oxide-based materials, zinc oxide-based materials, gallium oxide-based materials, and tin oxide-based materials. The transparent electrode, which is composed of such materials, has a lower refractive index relative to group III nitride semiconductors. For this reason, the light confinement structure constituted by the n-type group III nitride semiconductor clad layer and the transparent electrode makes the light emission peak (electric field strength peak) more likely to shift to the n-type semiconductor layer rather than to the active layer. In particular, in the case of generating blue-violet light with a wavelength of 400 nm to 410 nm, the active layer may be arranged to have an InGaN quantum well layer with a low In composition (e.g. approximately 6%). This makes it impossible to increase the refractive index of the active layer and thereby difficult to fit the light emission peak to the active layer. It is thus difficult to achieve a semiconductor laser device having adequate characteristics (e.g. sufficiently low threshold value). It is considered that this problem can be solved by reducing the refractive index of the n-type group III nitride semiconductor clad layer. More specifically, it suffices to compose the n-type clad layer of an AlGaN layer with a high Al composition. However, the Al composition is required to increase to 20% to balance the refractive index of the AlGaN layer and the refractive index of the transparent electrode. The AlGaN layer with such a high Al composition inevitably has a high electric resistance. Additionally, in the case of forming such a nitride semiconductor laminate structure on a GaN substrate, for example, since the AlGaN layer with a high Al composition (e.g. of 20%) has a large lattice mismatch with GaN, a crack may occur in the nitride semiconductor laminate structure to result in a reduced yield.

Hence, in the present invention, the n-type guide layer, which is disposed between the n-type clad layer and the active layer, includes a first guide layer composed of a superlattice layer in which an InGaN layer and an $Al_xGa_{1-x}N$ layer ($0 \leq X < 1$) are laminated periodically. This allows the refractive index of the first guide layer to be reduced so as to be balanced with the transparent electrode included in the p-side clad layer. More specifically, the superlattice layer can have an average refractive index of 2.6 or lower for an emission wavelength of 400 nm to 410 nm. Still more specifically, the In composition and film thickness of the InGaN layer and the Al composition X and film thickness of the $Al_xGa_{1-x}N$ layer ($0 \leq X < 1$) can be designed so that the superlattice layer has an average refractive index of 2.6 or lower. This allows the refractive index of p- and n-types on either side of the active layer to be balanced and thereby the light emission peak to be fitted to the active layer, whereby it is possible to provide a semiconductor laser device having adequate characteristics (especially, sufficiently low threshold value).

Meanwhile, the n-type clad layer and the first guide layer have their respective different compositions and therefore different crystal growth temperatures. That is, the growth temperature (e.g. 850° C. for InGaN/GaN superlattice layer) of the first guide layer composed of such an InGaN/$Al_xGa_{1-x}N$ superlattice layer ($0 \leq X < 1$) is lower than the growth temperature (e.g. 1050° C.) when the n-type clad layer is composed of, for example, an AlGaN layer, the refractive index of which is lower than the average refractive index of the first guide layer. Therefore, in the process of manufacturing such a semiconductor laser device, the first guide layer is required to be grown after the growth of the n-type clad layer and then wait for the fall in the temperature of the substrate. During this waiting period, the topmost surface (crystal surface) of the n-type clad layer is exposed to impurities in the atmosphere, which may cause the crystal surface to be deteriorated (e.g. oxidized). Hence, in the present invention, the n-type guide layer includes a second guide layer composed of an $In_{x2}Ga_{1-x2}N$ layer ($0 \leq X2 < 1$) and disposed between the first guide layer and the n-type clad layer. The crystal growth can occur continuously from the n-type clad layer to the first guide layer by forming the second guide layer during the temperature fall process after the growth of the n-type clad layer and continuously forming the first guide layer (superlattice layer). This can prevent the surface of the n-type clad layer from being deteriorated and thereby can improve the characteristics (especially, threshold value) of the semiconductor laser device.

The average In composition of the first guide layer may be different from the average In composition of the second guide layer. When the second guide layer is formed during the temperature fall process to the temperature suitable for the growth of the first guide layer after the growth of the n-type clad layer, the first and second guide layers have their respective different average In compositions. More specifically, the second guide layer may be composed of a single $In_{x2}Ga_{1-x2}N$ film having a gradient In composition X2 in the thickness direction. Continuing the crystal growth during the temperature fall process results in that the second guide layer has a gradient In composition in the thickness direction.

The second guide layer preferably has an optical film thickness of 500 Å or less. Since the $In_{x2}Ga_{1-x2}N$ layer ($0 \leq X2 < 1$) has a relatively high refractive index, thickening of the second guide layer would make the light emission peak more likely to shift to the n-side. Hence, the light emission peak can be fitted to the active layer by thinning the second guide layer to the minimum possible optical film thickness. Specifically, an optical film thickness of 500 Å or less cannot have a substantial impact on the device characteristics (especially, threshold value) and can improve the crystal quality of the nitride semiconductor laminate structure. The optical film thickness is given by the product of the refractive index (average refractive index) and the film thickness of the second guide layer.

Further, the average In composition of the second guide layer is preferably lower than the In composition of the InGaN layer included in the superlattice layer in the first guide layer. This can make the refractive index of the second guide layer lower than that of the first guide layer and thereby prevent the light emission peak from shifting to the n-side.

The second guide layer may be an undoped $In_{x2}Ga_{1-x2}N$ layer. This allows the second guide layer to serve as an optical guide layer. The undoped $In_{x2}Ga_{1-x2}N$ layer shows an n-type conductivity.

A fourth aspect of the present invention is directed to a semiconductor laser device for generating blue-violet light with an emission wavelength of 400 nm to 410 nm, including: an n-type group III nitride semiconductor layer; an active layer laminated on the n-type group III nitride semiconductor layer and having an InGaN quantum well layer; a p-type group III nitride semiconductor layer laminated on the active layer; and a transparent electrode in contact with the p-type group III nitride semiconductor layer, the electrode serving as a clad. The n-type group III nitride semiconductor layer includes an n-type clad layer and an n-type guide layer disposed between the n-type clad layer and the active layer. The n-type clad layer is composed of AlGaN having an Al composition of higher than 4% but lower than 9%.

In accordance with this arrangement, holes are injected from the transparent electrode via the p-type group III nitride semiconductor layer into the active layer, while electrons are injected from the n-type group III nitride semiconductor layer into the active layer. Recombination of these holes and electrons generates and emits blue-violet light with a wavelength of 400 nm to 410 nm. The light is confined between the transparent electrode serving as a clad and the n-type clad layer, and then propagates in a direction perpendicular to the direction of lamination of the nitride semiconductor laminate structure including the n-type group III nitride semiconductor layer, active layer, and p-type group III nitride semiconductor layer. The light then undergoes stimulated emissions repeatedly between resonator end surfaces arranged at both ends in the direction of propagation to be resonantly amplified and partially emitted through the resonator end surfaces as a laser beam.

The transparent electrode contains one or two or more of, for example, indium oxide-based materials, zinc oxide-based materials, gallium oxide-based materials, and tin oxide-based materials. The transparent electrode, which is composed of such materials, has a lower refractive index relative to group III nitride semiconductors. For this reason, the light confinement structure constituted by the n-type group III nitride semiconductor clad layer and the transparent electrode makes the light emission peak (electric field strength peak) more likely to shift to the n-type semiconductor layer rather than to the active layer. In particular, the InGaN quantum well layer included in the active layer is required to have a low In composition (e.g. approximately 6%) to generate blue-violet light with a wavelength of 400 nm to 410 nm. This makes it impossible to increase the refractive index of the active layer and thereby difficult to fit the light emission peak to the active layer. It is thus difficult to achieve a semiconductor laser device having adequate characteristics (e.g. sufficiently low threshold value). It is considered that this problem can be solved by reducing the refractive index of the n-type group III nitride semiconductor clad layer. More specifically, it suffices to compose the n-type clad layer of an AlGaN layer with a high Al composition. However, the Al composition is required to increase to 20% to balance the refractive index of the AlGaN layer and the refractive index of the transparent electrode. The AlGaN layer with such a high Al composition inevitably has a high electric resistance. Additionally, in the case of forming such a nitride semiconductor laminate structure on a GaN substrate, for example, since the AlGaN layer with a high Al composition (e.g. of 20%) has a large lattice mismatch with GaN, a crack may occur in the nitride semiconductor laminate structure to result in a reduced yield.

Hence, in the present invention, the n-type AlGaN clad layer has an Al composition of 4 to 9%. If the Al composition is 4% or lower, the n-type clad layer has a high refractive index and the light emission peak shifts to the n-side with respect to the active layer, resulting in a high threshold value. On the other hand, if the Al composition is 9% or higher, cracks may occur on the entire surface of the n-type AlGaN clad layer with, for example, a thickness of 1 μm to 1.5 μm.

The n-type clad layer preferably includes a superlattice layer in which an $Al_{x3}Ga_{1-x3}N$ layer (0<X3<1) and an $Al_{x4}Ga_{1-x4}N$ layer (0<X4<X3) are laminated periodically and the superlattice layer preferably has an average Al composition of higher than 4% but lower than 9%.

In accordance with this arrangement, the n-type clad layer includes a superlattice layer in which a pair of AlGaN layers having their respective different Al compositions are laminated alternately. Such a superlattice layer can have a high average Al composition without crack generation. This allows the light emission peak to be fitted to the active layer with no yield reduction.

The n-type clad layer may be entirely composed of the superlattice layer. This allows the n-type clad layer with a high average Al composition to be thickened (e.g. 1 μm to 1.5 μm) without crack generation.

The n-type clad layer may be arranged to include the superlattice layer and an AlGaN layer other than the superlattice layer. In this case, the AlGaN layer other than the superlattice layer is preferably disposed closer to the active layer than the superlattice layer. Further, in this case, the average Al composition of the superlattice layer is preferably higher than the average Al composition of the AlGaN layer other than the superlattice layer. The average Al composition of the superlattice layer can be higher than the Al composition of the single AlGaN film. Since such a superlattice layer with a high average Al composition has a low refractive index, disposing the superlattice layer farther from the active layer makes it easy to fit the light emission peak to the active layer.

The n-type guide layer may include a superlattice layer in which an InGaN layer and an $Al_xGa_{1-x}N$ layer (0≤X≤0.04) are laminated periodically. In this case, the n-type clad layer is preferably in contact with the n-type guide layer on the opposite side of the active layer.

In accordance with this arrangement, the n-type guide layer includes a superlattice layer in which an InGaN layer and an $Al_xGa_{1-x}N$ layer (0≤X≤0.04) are laminated periodically. This allows the n-type guide layer to have a low refractive index (e.g. 2.6 or lower) and thus allows the refractive index of p- and n-types on either side of the active layer to be balanced for blue-violet light with a wavelength of 400 nm to 410 nm and thereby the light emission peak to be fitted to the active layer, whereby it is possible to provide a semiconductor laser device having adequate characteristics (especially, sufficiently low threshold value).

The Al composition X of the $Al_xGa_{1-x}N$ layer included in the superlattice layer in the n-type guide layer may be zero. That is, an InGaN layer and a GaN layer may be laminated periodically in the superlattice layer.

The $Al_xGa_{1-x}N$ layer included in the superlattice layer may also have an Al composition X of 0<X≤0.04. The refractive index of $Al_xGa_{1-x}N$ (X>0) is lower than the refractive index of GaN and becomes lower as the Al composition increases. Therefore, using the $Al_xGa_{1-x}N$ layer (X>0) allows the average refractive index of the n-type guide layer to be reduced to 2.6 or lower even if the n-type guide layer may have a large physical film thickness (absolute film thickness). That is, the range of the physical film thickness of the n-type guide layer can be widened, so that the degree of freedom of the design increases. For example, the n-type guide layer can have a relatively large physical film thickness while having an optical film thickness of 1000 Å to 4000 Å. This can provide a high-intensity semiconductor laser device by, for example, increasing the physical film thickness of the n-type guide layer to improve the light emission intensity. Meanwhile, if the Al composition X of the $Al_xGa_{1-x}N$ layer is too high, the n-type guide layer has a refractive index lower than that of the n-type clad layer, which is composed of an AlGaN with an Al composition of 4 to 9%, which may result in poor light confinement. Therefore, the Al composition X is preferably 0.04 or lower (4% or lower).

In any of the aspects mentioned above, the nitride semiconductor laminate structure may not have a p-type semiconductor clad layer. If the nitride semiconductor laminate structure has a p-type semiconductor clad layer, the active layer (light emitting layer) is formed at a relatively low temperature and thereafter the p-type semiconductor clad layer is formed at a temperature higher than that where the active layer is formed in the process of forming the nitride semiconductor laminate structure. This may result in that the active layer is thermally damaged during the formation of the p-type semiconductor clad layer. Whereas, this aspect, in which the nitride semiconductor laminate structure may not have a p-type semiconductor clad layer, can prevent a thermal damage to the active layer in the process of forming the nitride semiconductor laminate structure.

Also, in any of the aspects above, the transparent electrode preferably includes a first conductive film composed of an indium oxide-based material and formed in contact with the p-type group III nitride semiconductor layer and a second conductive film composed of a zinc oxide-based, gallium oxide-based, or tin oxide-based material and laminated on the first conductive film.

The transparent electrode is required to have a certain thickness to confine light from the light emitting layer with the n-type clad layer. However, since the first conductive film composed of an indium oxide-based material has a low film formation rate, it takes time to grow the transparent electrode, if composed only of the first conductive film, to a required thickness. On the other hand, the second conductive film composed of a zinc oxide-based, gallium oxide-based, or tin oxide-based material has a relatively high film formation rate, but a high contact resistance with p-type nitride semiconductors. Hence, the portion in contact with the p-type group III nitride semiconductor layer is formed by the first conductive film composed of an indium oxide-based material to reduce contact resistance, while the second conductive film composed of a zinc oxide-based, gallium oxide-based, or tin oxide-based material is laminated on the first conductive film to increase the rate of growth of the transparent electrode to a required thickness. More specifically, it is possible to shorten the time required for the formation of the transparent electrode and thereby improve the productivity by forming the first conductive film at a minimum film thickness.

The p-type semiconductor layer may include a first p-type guide layer laminated on the active layer, a p-type electron blocking layer laminated on the first p-type guide layer, a second p-type guide layer laminated on the p-type electron blocking layer and having a p-type impurity concentration higher than that of the first p-type guide layer, and a p-type contact layer laminated on the second p-type guide layer and having a p-type impurity concentration higher than that of the second p-type guide layer.

In accordance with this arrangement, the p-type electron blocking layer, which is disposed between the first and second p-type guide layers, can reflect electrons to the active layer to increase the electron injection efficiency into the active layer. The first and second p-type guide layers, which are disposed on either side of the p-type electron blocking layer, contribute to carrier and light confinement in the active layer. The p-type contact layer, which is in contact with the transparent electrode and has a high p-type impurity concentration, has a reduced contact resistance with the transparent electrode. The second p-type guide layer has a p-type impurity concentration lower than that of the p-type contact layer, and further the first p-type guide layer has a p-type impurity concentration lower than that of the second p-type guide layer. That is, the closer the active layer is, the lower the p-type impurity concentration becomes, whereby light absorption by impurities can be suppressed.

The p-type contact layer may be at least partially trenched to form a ridge portion. This can provide a current confinement structure in which current concentrates on the ridge portion. The ridge portion is preferably formed in a stripe-like manner along the resonator. Then, insulating films are preferably arranged on either side of the ridge portion. This causes the insulating films to be arranged closer to the light emitting layer to enhance transverse light confinement, while ensuring a certain thickness of the p-type semiconductor layer including the p-type contact layer to confine light also in the longitudinal direction, whereby the emission threshold value can be reduced.

The second p-type guide layer preferably has a thickness of 50 nm or less. In particular, if such a ridge portion as mentioned above is formed, reducing the thickness of the second p-type guide layer to 50 nm or less allows the insulating films on either side of the ridge portion to be made even closer to the light emitting layer. This can further enhance the transverse light confinement to contribute to the reduction in the emission threshold value.

Further, the p-type contact layer preferably has a p-type impurity concentration of $1 \times 10^{20}$ cm$^{-3}$ or higher, and the first and second p-type guide layers preferably have a p-type impurity concentration of $5 \times 10^{18}$ cm$^{-3}$ or higher but $5 \times 10^{19}$ cm$^{-3}$ or lower. With this arrangement, the contact resistance between the p-type contact layer and the second conductive film can be reduced and light absorption by the first and second p-type guide layers can be suppressed.

The p-type semiconductor layer preferably has a total film thickness of 1500 Å or less. This can make the device thinner.

It will be understood that the above-described features may be combined in any combination.

Other elements, features, steps, characteristics and advantages of the present invention will become more apparent from the following detailed description of the preferred embodiments with reference to the attached drawings.

BRIEF DESCRIPTION OF THE DRAWINGS

FIG. 2A is a partially-enlarged schematic cross-sectional view of the semiconductor laser device.

FIG. 15 illustrates an exemplary arrangement of a superlattice constituting the first n-type guide layer.

DETAILED DESCRIPTION OF THE PREFERRED EMBODIMENTS

Figure 1:
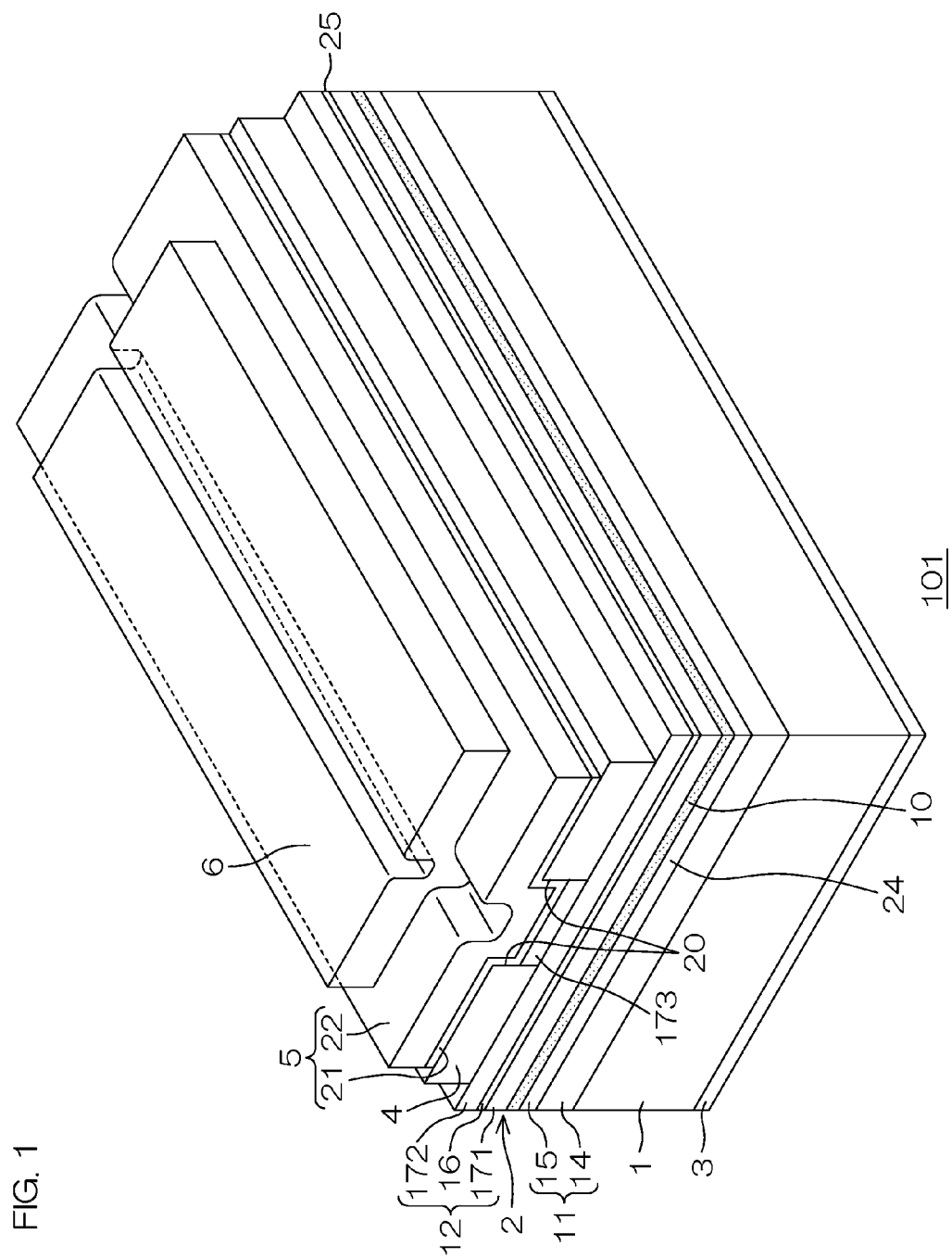
FIG. 1 is a schematic perspective view illustrating an arrangement of a semiconductor laser device according to a preferred embodiment of the present invention, with substantial parts being cut out.
Figure 2:
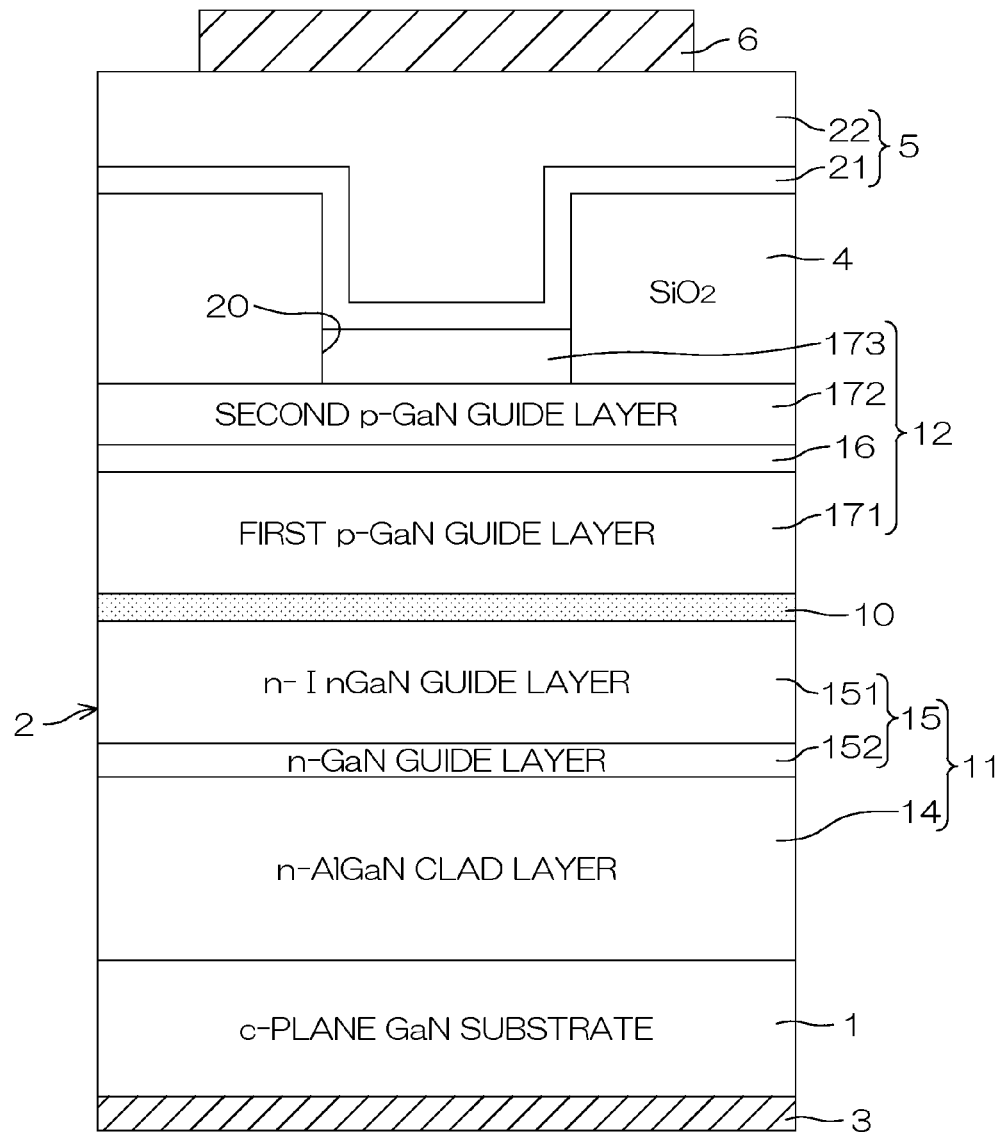
FIG. 2 is a schematic cross-sectional view showing a cross section orthogonal to a resonator direction.

FIG. 1 is a schematic perspective view illustrating an arrangement of a semiconductor laser device according to a first preferred embodiment of the present invention, with substantial parts being cut out. FIG. 2 is a schematic cross-sectional view showing a cross section orthogonal to a resonator direction.

The semiconductor laser device 101 is a Fabry-Perot type one including a substrate 1, a nitride semiconductor laminate structure 2 formed by crystal growth (epitaxial growth) on the substrate 1, an n-side electrode pad 3 formed in contact with a rear surface (on the opposite side of the nitride semiconductor laminate structure 2) of the substrate 1, an insulating film 4 formed in contact with the surface of the nitride semiconductor laminate structure 2, a transparent electrode 5 formed on the insulating film 4 in partial contact with the surface of the nitride semiconductor laminate structure 2 to serve as a p-side electrode, and a p-side electrode pad 6 formed on the transparent electrode 5.

In this preferred embodiment, the substrate 1 is composed of a GaN monocrystalline substrate. The substrate 1 has a c-plane, for example, as a major surface, and the nitride semiconductor laminate structure 2 is formed by crystal growth on the major surface. The nitride semiconductor laminate structure 2 is thus composed of a nitride semiconductor having a c-plane as a crystal growth major surface. It will be understood that the major surface of the substrate 1 may be constituted by an m-plane or a-plane. In any case, the crystal growth major surface of the nitride semiconductor laminate structure 2 conforms to the crystal plane on the major surface of the substrate 1.

The nitride semiconductor laminate structure 2 includes a light emitting layer 10 (active layer), an n-type semiconductor layer 11, and a p-type semiconductor layer 12. In the drawings, the light emitting layer 10 is indicated by a dotted region. The n-type semiconductor layer 11 is arranged closer to the substrate 1 with respect to the light emitting layer 10, while the p-type semiconductor layer 12 is arranged closer to the transparent electrode 5 with respect to the light emitting layer 10. The light emitting layer 10 is thus placed between the n-type semiconductor layer 11 and the p-type semiconductor layer 12 to form a double heterojunction. Into the light emitting layer 10, electrons are injected from the n-type semiconductor layer 11 and holes are injected from the p-type semiconductor layer 12. Recombination of these electrons and holes in the light emitting layer 10 generates and emits light.

The n-type semiconductor layer 11 is arranged by laminating an n-type clad layer 14 (with a thickness of 1.0 µm, for example) and an n-type guide layer 15 (with a thickness of 100 nm, for example) in this order from the substrate 1.

Meanwhile, the p-type semiconductor layer 12 is formed on the light emitting layer 10. The p-type semiconductor layer 12 contains Mg at a concentration of $1 \times 10^{19}$ cm$^{-3}$ or higher in total. The p-type semiconductor layer 12 is arranged by laminating a first p-type guide layer 171, a p-type electron blocking layer 16 (with a thickness of 100 Å, for example), a second p-type guide layer 172, and a p-type contact layer 173 (with a thickness of 100 nm, for example) in this order from the light emitting layer 10. The p-type contact layer 173 is provided as a superficial portion in the p-type semiconductor layer 12 on the side closer to the transparent electrode 5.

The light emitting layer 10 has a multiple-quantum well (MQW) structure including, for example, an InGaN quantum well layer, in which light is generated through recombination of electrons and holes and the generated light is amplified. Specifically, the light emitting layer 10 is arranged by alternately laminating an undoped InGaN layer 51 (with a thickness of 100 Å or less and, for example, of 3 nm) and an undoped GaN or InGaN layer 52 (with a thickness of 20 nm or less and, for example, of 9 nm) repeatedly and periodically, as shown in an enlarged manner in FIG. 2A. In this case, the InGaN layer 51 has an In composition ratio of 5% or higher and thereby has a relatively narrow bandgap to constitute a quantum well layer. On the other hand, the GaN or InGaN layer 52 serves as a barrier layer having a relatively wide bandgap. For example, two to seven periodic sets of the InGaN layer 51 and the barrier layer 52 are laminated alternately and repeatedly to constitute the light emitting layer 10 with such an MQW structure. The emission wavelength is set to, for example, 400 nm or longer but 410 nm or shorter by adjusting the In composition of the quantum well layer (InGaN layer 51). The emission wavelength of around 405 nm corresponding to the blue-violet region can be obtained by adjusting the In composition of the quantum well layer to 6% to 8% (e.g. 7%). The MQW structure preferably includes three or less quantum wells containing In.

The first p-type guide layer 171 contains Mg, a p-type impurity, doped at a concentration of, for example, $5 \times 10^{18}$ cm$^{-3}$ or higher but $5 \times 10^{19}$ cm$^{-3}$ or lower, and has a thickness of approximately 0 to 500 Å. The first p-type guide layer 171 may be a p-type $Al_{x1}Ga_{1-x1}N$ layer ($0 \leq X1 < 1$; GaN layer if X1=0).

The p-type contact layer 173 forms a stripe-like ridge portion running along the resonator. That is, the p-type contact layer 173 is formed in a stripe-like manner, the both sides of which in the direction orthogonal to the resonator direction are trenched to the second p-type guide layer 172.

The p-type electron blocking layer 16 is composed of a p-type AlGaN or p-type AlInGaN with an Al composition of 15% to 25% and has a thickness of 300 Å or less and, for example, of approximately 200 Å. The p-type electron blocking layer 16 is formed between the first p-type guide layer 171 and the second p-type guide layer 172. The p-type electron blocking layer 16 is a p-type semiconductor formed by doping a p-type dopant, e.g. Mg, into AlGaN or AlInGaN (at a doping concentration of, for example, $5 \times 10^{19}$ cm$^{-3}$ or higher) for preventing outflow of electrons from the light emitting layer 10 to increase the recombination efficiency between electrons and holes.

The second p-type guide layer 172 contains p-type impurities at a concentration of $5 \times 10^{18}$ cm$^{-3}$ or higher but $5 \times 10^{19}$ cm$^{-3}$ or lower and higher than that in the first p-type guide layer 171. The second p-type guide layer 172 may be a p-type GaN layer. The second p-type guide layer 172 is formed in a manner so as to entirely cover the p-type electron blocking layer 16 at a thickness of, for example, 50 nm or less. The p-type contact layer 173 is composed of, for example, a p-type GaN layer and is doped with Mg, a p-type impurity, at a concentration higher than that in the second p-type guide layer 172. For example, the p-type impurity concentration (Mg concentration) in the p-type contact layer 173 is preferably $1 \times 10^{20}$ cm$^{-3}$ or higher. The p-type contact layer 173 may have a thickness of approximately 30 nm. In order to make the device thinner, the p-type semiconductor layer 12 is preferably formed at a thickness of 1500 Å or less in total including the p-type contact layer 173, which constitutes the ridge portion.

The insulating film 4 is composed of, for example, $ZrO_2$ or $SiO_2$ and has a thickness of 200 nm or more but 400 nm or less. The insulating films 4 are disposed on either side of the p-type contact layer 173, which constitutes the ridge portion, to cause the top surface of the p-type contact layer 173 to be exposed through an opening portion 20. That is, the insulating films 4 are in contact with the second p-type guide layer 172 on either side of the ridge-like p-type contact layer 173.

The transparent electrode 5 is arranged by laminating a first conductive film 21 and a second conductive film 22 in this order from the p-type semiconductor layer 12. The first conductive film 21 is composed of an indium oxide-based material (e.g. ITO). The first conductive film 21 enters the opening portion 20 to be in ohmic contact with the p-type contact layer 173 and further extends outside the opening portion 20 onto the surface of the insulating film 4. The second conductive film 22 is composed of a zinc oxide-based, gallium oxide-based, or tin oxide-based material (e.g. ZnO) and is formed in a manner so as to entirely cover the surface of the first conductive film 21. The transparent electrode 5 has a thickness of approximately 400 nm in total.

The first conductive film 21 is a transparent oxide film with a thickness of 2 nm or more but 30 nm or less (preferably 10 nm). The term "transparent" means that the film is transparent to the emission wavelength of the light emitting layer 10 and, specifically, that the transmissivity to the emission wavelength is, for example, 70% or higher. The first conductive film 21 is formed continuously and entirely on the region of the surface (upper surface in FIG. 2) of the insulating film 4 excluding the opening portion 20, the region of the pair of side surfaces of the insulating film 4 fringing the opening portion 20, and the region of the surface of the p-type contact layer 173 exposed through the opening portion 20. That is, the first conductive film 21 is formed on the insulating film in contact with the p-type contact layer 173 (p-type semiconductor layer 12) via the opening portion 20.

The first conductive film 21 is composed of a material having, for example, the following features (1) to (3):
(1) an electron concentration of $1 \times 10^{19}$ cm$^{-3}$ or higher;
(2) a transmissivity of 70% or higher to the emission wavelength of the light emitting layer 10; and
(3) a work function of 5.0 eV or higher.

Indium oxide ($In_2O_3$)-based materials have the above features. Specifically, in this preferred embodiment, the first conductive film 21 is composed of ITO. In this case, the contact resistance between the first conductive film 21 and the p-type semiconductor layer 12 is $1 \times 10^{-3}$ Ω·cm$^2$ or lower. The indium oxide-based material of the first conductive film 21 preferably contains Sn at a composition of 3% or higher.

The second conductive film 22 is a transparent oxide film with a thickness of 400 nm or more but 600 nm or less. That is, the second conductive film 22 has a transmissivity of 70% or higher to the emission wavelength of the light emitting layer 10. The second conductive film 22 is formed entirely on the surface (upper surface in FIG. 2) of the first conductive film 21. The second conductive film 22 is composed of a zinc oxide (ZnO)-based, gallium oxide ($Ga_2O_3$)-based, or tin oxide (SnO)-based material. Specifically, the second conductive film 22 is composed of ZnO or MgZnO containing group III atoms (Ga or Al) at a concentration of $1 \times 10^{19}$ cm$^{-3}$ or higher. If the second conductive film 22 is composed of MgZnO, the refractive index of the second conductive film 22 can be adjusted by changing the Mg composition. The Mg composition of MgZnO is preferably 50% or lower. Specifically, MgZnO contained in the second conductive film 22 can be represented as $Mg_xZn_{1-x}O$ ($0 \leq X < 1$).

The transparent electrode 5 serves as an upper clad layer to exert a light confinement effect with the n-type clad layer 14 whereby light from the light emitting layer 10 can be confined around the light emitting layer 10. Therefore, the refractive index of the first conductive film 21 and the second conductive film 22 included in the transparent electrode 5 is lower than the refractive index of the light emitting layer 10. Specifically, while the light emitting layer 10 has an average refractive index of 2.7, the first conductive film 21, if composed of ITO, has a refractive index of 2.1 and the second conductive film 22, if composed of ZnO, has a refractive index of 2.2. The insulating film 4, if composed of $SiO_2$, has a low refractive index of 1.4 and thereby also exerts a light confinement effect.

Since light from the light emitting layer 10 can be confined between the transparent electrode 5 and the n-type clad layer 14, the semiconductor laser device 101 includes no clad layer composed of a p-type nitride semiconductor (p-type semiconductor clad layer). That is, the nitride semiconductor laminate structure 2 includes no p-type semiconductor clad layer.

The n-side electrode pad 3 has a multilayer structure in which an Al layer, a Ti layer, and an Au layer are laminated in this order from the substrate 1, for example, and the Al layer is in ohmic contact with the substrate 1.

The p-side electrode pad 6 has a laminated electrode film structure in which a Ti layer and an Au layer are laminated in this order from the substrate 1, for example.

The n-type guide layer 15 is formed on the n-type clad layer 14. The n-type guide layer 15 is a semiconductor layer that exerts a carrier confinement effect whereby carriers (electrons) are confined in the light emitting layer 10. This can increase the recombination efficiency between electrons and holes in the light emitting layer 10. In this preferred embodiment, the n-type guide layer 15 includes a first n-type guide layer 151 and a second n-type guide layer 152. The second n-type guide layer 152 is disposed between the n-type clad layer 14 and the first n-type guide layer 151. The first n-type guide layer 151 is disposed between the light emitting layer 10 and the second n-type guide layer 152.

As shown in an enlarged manner in FIG. 2A, the first n-type guide layer 151 is composed of a superlattice layer in which an InGaN layer 61 and a GaN layer 62 are laminated periodically. More specifically, the superlattice structure is formed by alternately laminating the GaN layer 62 and the InGaN layer 61 in the order of GaN layer 62, InGaN layer 61, GaN layer 62, . . . from the GaN substrate 1. The first n-type guide layer 151 has an average refractive index of 2.6 or lower. The InGaN layer 61 included in the superlattice layer has an In composition of, for example, 6% or lower (more preferably 4% or lower), being lower than the In composition of the InGaN quantum well layer 51 included in the light emitting layer 10. The InGaN layer 61 included in the first n-type guide layer 151 (superlattice layer) is in contact with the barrier layer 52 in the light emitting layer 10. The first n-type guide layer 151 also has an optical film thickness of 1000 Å or more but 4000 Å or less.

The average refractive index of the first n-type guide layer 151 is given by the following formula using the refractive index $n_{InGaN}$ and film thickness $T_{InGaN}$ of the InGaN layer 61 and the refractive index $n_{GaN}$ and film thickness $T_{GaN}$ of the GaN layer 62 included in the superlattice layer. In this formula, the denominator represents layer thickness per period and the numerator represents optical film thickness per period.

$$\text{Average refractive index} = \frac{n_{InGaN} \times T_{InGaN} + n_{GaN} \times T_{GaN}}{T_{InGaN} + T_{GaN}}$$

The optical film thickness of the superlattice layer included in the first n-type guide layer 151 is given by the following formula using the number N of repetitive periods in the superlattice layer (i.e. the number of pairs of InGaN layer 61 and GaN layer 62).

Optical film thickness=$(n_{InGaN} \cdot T_{InGaN} + n_{GaN} \cdot T_{GaN}) \times N$ The second n-type guide layer 152 is composed of an $In_{x2}Ga_{1-x2}N$ layer (0≤X2<1; GaN layer if X2=0). The average In composition of the first n-type guide layer 151 is different from the average In composition of the second n-type guide layer 152. Specifically, the average In composition of the first n-type guide layer 151 is higher than the average In composition of the second n-type guide layer 152. More specifically, the average In composition of the second n-type guide layer 152 is lower than the In composition of the InGaN layer 61 included in the superlattice layer of the first n-type guide layer 151. The second n-type guide layer 152 is also composed of a single undoped $In_{x2}Ga_{1-x2}N$ film having a gradient In composition X2 in the thickness direction. The second n-type guide layer 152 preferably has an optical film thickness of 500 Å or less. The optical film thickness in this case is given by the product of the refractive index and the film thickness of the second n-type guide layer 152.

The n-type clad layer 14 is formed on the substrate 1 to exert a light confinement effect whereby light from the light emitting layer 10 can be confined around the light emitting layer 10. The n-type clad layer 14 is an n-type semiconductor formed by doping Si as an n-type dopant into AlGaN (at a doping concentration of, for example, $1 \times 10^{18}$ cm$^{-3}$). The n-type clad layer 14 has a bandgap wider than that of the n-type guide layer 15. This allows the n-type clad layer 14 to have a refractive index sufficiently lower than that of the n-type guide layer 15, resulting in good confinement and the semiconductor laser device 101 can have a low threshold value and high efficiency.

In more detail, the n-type clad layer 14 is composed of an AlGaN with an Al composition of higher than 4% but lower than 9%. More specifically, the n-type clad layer 14 is composed of a superlattice layer in which an $Al_{x3}Ga_{1-x3}N$ layer 71 (0<X3<1) and an $Al_{x4}Ga_{1-x4}N$ layer 72 (0<X4<X3) are laminated periodically, as shown in an enlarged manner in FIG. 2A. Then, the superlattice layer has an average Al composition of higher than 4% but lower than 9%. The n-type clad layer 14 is in contact with the n-type guide layer 15 on the opposite side of the light emitting layer 10.

The nitride semiconductor laminate structure 2 has a pair of end surfaces 24 and 25 (cleavage planes) formed by cleavage at the both ends in the resonator direction. The pair of end surfaces 24 and 25 are in parallel with each other and both perpendicular to the resonator direction. The n-type semiconductor layer 11, light emitting layer 10, and p-type semiconductor layer 12 thus form a Fabry-Perot resonator in which the end surfaces 24 and 25 serve as resonator end surfaces. That is, light generated in the light emitting layer 10 undergoes stimulated emissions while reciprocating between the resonator end surfaces 24 and 25 to be amplified. The amplified light is partially emitted from the device through the resonator end surfaces 24 and 25 as a laser beam. A multiple reflection film (not shown), for example, is formed on the resonator end surfaces 24 and 25. For example, the multiple reflection film on the resonator end surface 24 is designed to have a reflectance lower than that of the multiple reflection film on the resonator end surface 25. This causes a higher laser beam to be emitted from the device through the resonator end surface 24. That is, the resonator end surface 24 serves as a laser emitting end surface.

The above arrangement makes it possible to generate blue-violet light with a wavelength of, for example, 400 nm to 410 nm by connecting the n-side electrode pad 3 and the transparent electrode 5 to a power supply to inject electrons and holes from the n-type semiconductor layer 11 and the p-type semiconductor layer 12 into the light emitting layer 10 and thereby recombining electrons and holes in the light emitting layer 10. The light is confined between the n-type clad layer 14 and the transparent electrode 5 (upper clad layer) and propagates in the resonator direction, which is perpendicular to the direction of lamination of the nitride semiconductor laminate structure 2. Specifically, the light undergoes stimulated emissions while reciprocating between the resonator end surfaces 24 and 25 in the resonator direction along the guide layers 15 and 171 to be amplified. Then, a higher laser output is to be emitted through the resonator end surface 24 serving as a laser emitting end surface.

Figure 3:
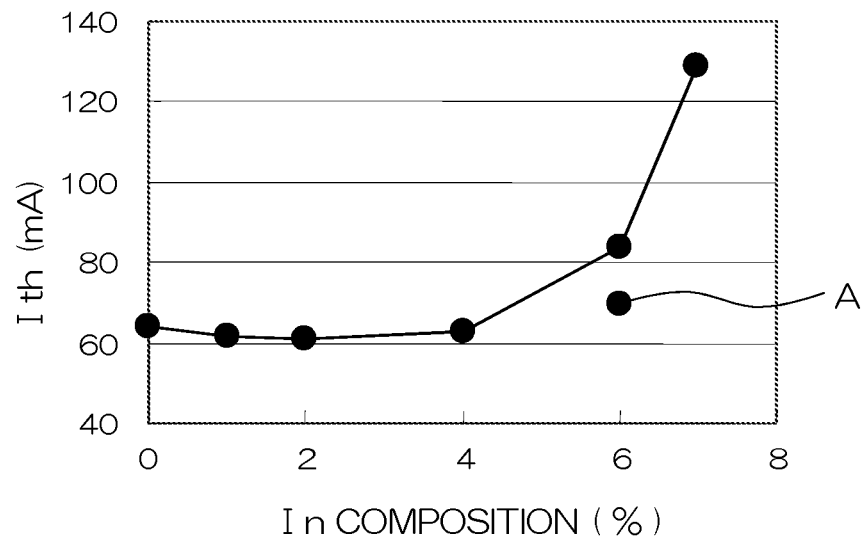
FIG. 3 shows a relationship between the In composition of a first n-type guide layer and the emission threshold value.

FIG. 3 shows a relationship between the In composition of the first n-type guide layer 151 and the emission threshold value (Ith) and, more specifically, a relationship between the In composition of the InGaN layer 61 (see FIG. 2A) in the first n-type guide layer 151, which is composed of an InGaN/GaN superlattice layer, and the emission threshold value. In this case, the InGaN/GaN superlattice layer includes an InGaN layer 61 with a thickness of 10 Å and a GaN layer 62 with a thickness of 30 Å and has a periodic number (the number of pairs of InGaN layer and GaN layer) of 40. Therefore, the periodic thickness is 40 Å and the total film thickness is 1600 Å. FIG. 3 shows that the threshold value increases rapidly at an In composition of higher than 6%. That is, the InGaN layer preferably has an In composition of 6% or lower. Since the threshold value is saturated around a lower limit if the In composition is 4% or lower, the InGaN layer more preferably has an In composition of 4% or lower. If the In composition is 4%, the first n-type guide layer 151 (InGaN/GaN superlattice layer) has an average refractive index of 2.6. The reference sign A denotes a calculation result when the thickness of the InGaN layer 61 and the GaN layer 62 is designed so that the InGaN layer 61 has an In composition of 6% and the InGaN/GaN superlattice layer has an average refractive index of 2.6. Also in this case, the threshold value is sufficiently low. The threshold value can thus be reduced sufficiently by designing the InGaN/GaN superlattice layer in a manner so as to have an average refractive index of 2.6 or lower. The average refractive index can be calculated using the refractive index and film thickness ratio of the InGaN and GaN.

Figure 4:
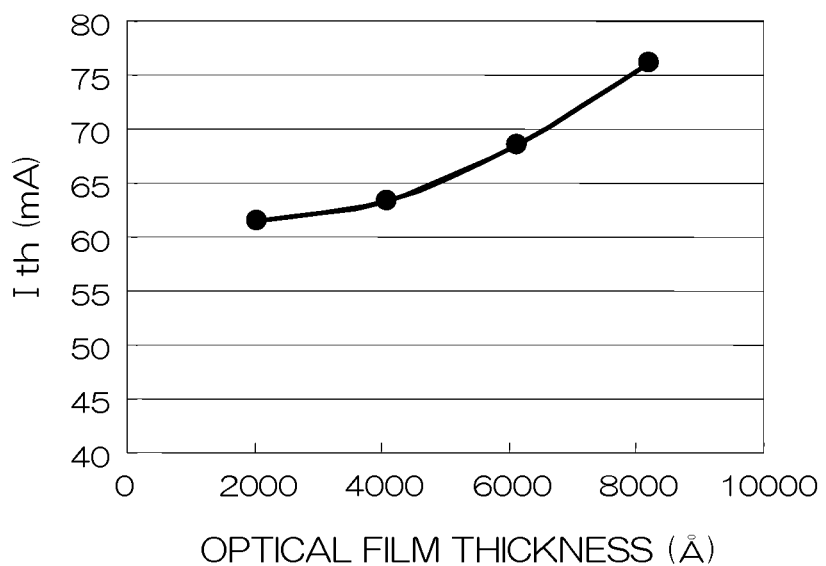
FIG. 4 shows a relationship between the optical film thickness of the first n-type guide layer (InGaN/GaN superlattice layer) and the emission threshold value.

FIG. 4 shows a relationship between the optical film thickness of the first n-type guide layer 151 (InGaN/GaN superlattice layer) and the emission threshold value (Ith). In this case, the InGaN/GaN superlattice layer includes an InGaN layer 61 with a thickness of 10 Å and a GaN layer 62 with a thickness of 30 Å (see FIG. 2A), and the InGaN layer 61 has an In composition of 4%. Threshold values are then obtained for various optical film thicknesses by changing the periodic number (the number of pairs of InGaN layer 61 and GaN layer 62). FIG. 4 shows that the threshold value can be reduced by reducing the optical film thickness and starts to be saturated at an optical film thickness of 4000 Å or less. If the optical film thickness is less than 1000 Å, no emission occurs. Therefore, the first n-type guide layer 151 (InGaN/GaN superlattice layer) preferably has an optical film thickness of 1000 Å or more but 4000 Å or less.

Figure 5:
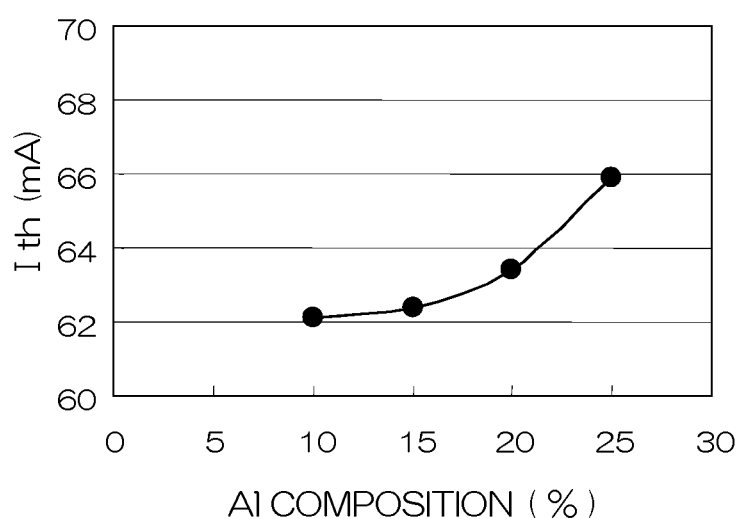
FIG. 5 shows a relationship between the Al composition of a p-type electron blocking layer and the emission threshold value.

FIG. 5 shows a relationship between the Al composition of the p-type electron blocking layer 16 and the emission threshold value (Ith), showing that the lower the Al composition of the p-type electron blocking layer 16 is, the lower the threshold value becomes. FIG. 5 also shows that the reduction in the threshold value slows down if the Al composition is 15% or lower. However, since a low Al composition impairs the electron blocking feature, the output power should be evaluated to determine an Al composition.

Figure 6:
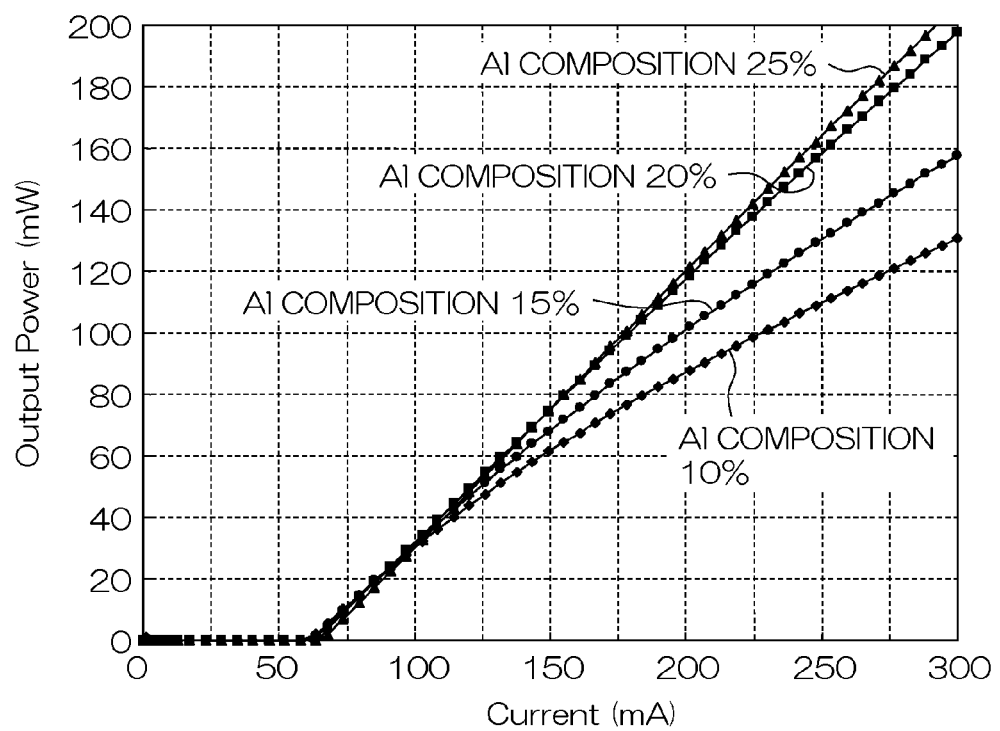
FIG. 6 shows a relationship between the Al composition and the output power.

FIG. 6 shows a relationship between the Al composition and the output power. The horizontal axis represents the input current, while the vertical axis represents the output power. There are shown calculation results when the Al composition is 10%, 15%, 20%, and 25%. FIG. 6 implies the tendency that the lower the Al composition is, the lower the output power becomes within the high-current region. Based on the tendency of the threshold value and the output power, the p-type electron blocking layer 16 appropriately has an Al composition of 15% or higher but 25% or lower.

Figure 7:
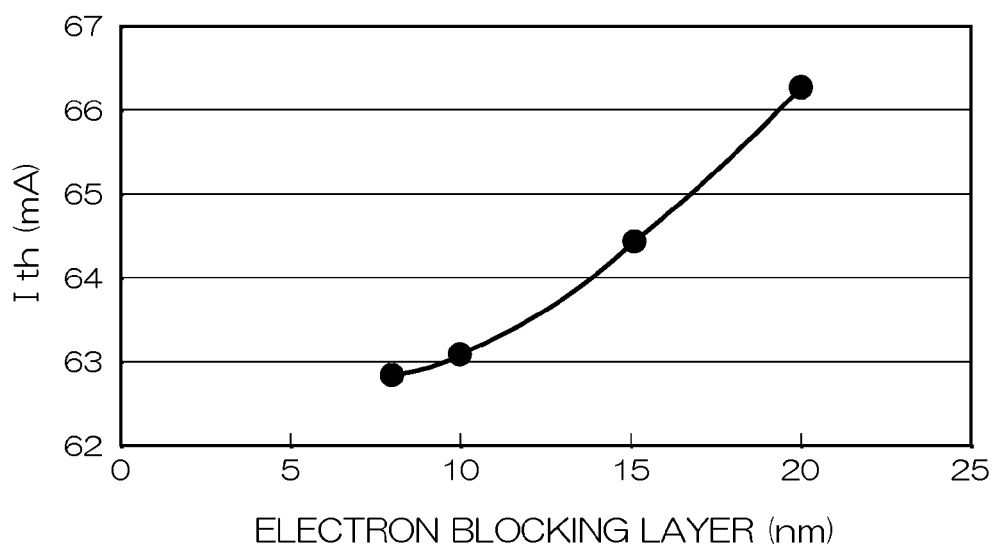
FIG. 7 shows a relationship between the thickness of the p-type electron blocking layer and the emission threshold value.

FIG. 7 shows a relationship between the thickness of the p-type electron blocking layer 16 and the emission threshold value (Ith), showing a calculation result when the Al composition is 20%. The smaller the film thickness of the p-type electron blocking layer 16 is, the lower the threshold value becomes, but the threshold value shows a low rate of change if the thickness is 120 Å or less. Since the refractive index of AlGaN with an Al composition of 20% for light with a wavelength of 405 nm is 2.22, the optical film thickness is satisfactorily 2.66 Å (≈120 Å×2.22) or less. Since the Al composition is allowed up to 25%, the optical film thickness of the p-type electron blocking layer 16 is satisfactorily approximately 300 Å or less. However, the p-type electron blocking layer 16, if having an excessively small thickness, cannot effectively reflect electrons toward the light emitting layer 10. Therefore, the p-type electron blocking layer 16 preferably has an optical film thickness of 160 Å or more.

Figure 8:
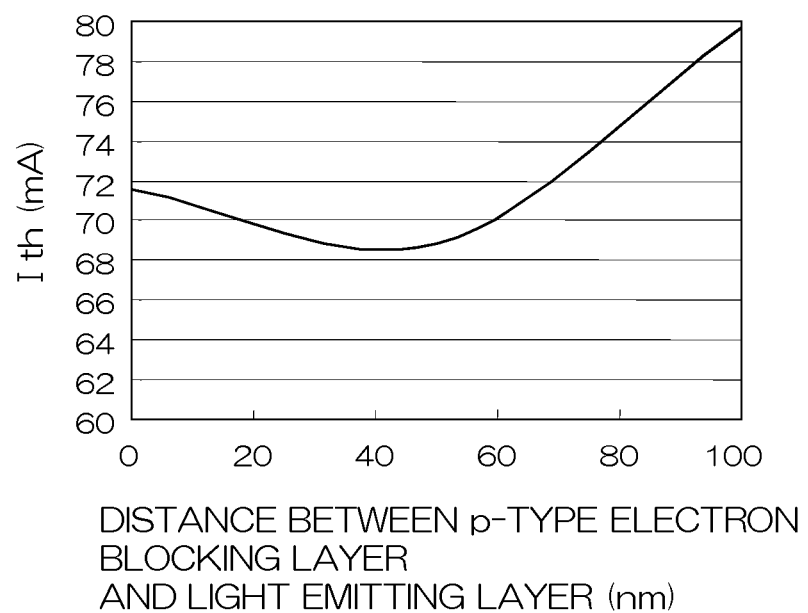
FIG. 8 shows an obtained relationship between the thickness of a first p-type guide layer (distance between the p-type electron blocking layer and a light emitting layer) and the emission threshold value.

FIG. 8 shows an obtained relationship between the thickness of the first p-type guide layer 171 (distance between the p-type electron blocking layer 16 and the light emitting layer 10) and the emission threshold value (Ith), showing a calculation result when the first p-type guide layer 171 is composed of a p-type GaN layer. FIG. 8 shows that the threshold value starts to increase if the first p-type GaN guide layer 171 has a thickness of more than 500 Å. Therefore, the first p-type GaN guide layer 171 preferably has a thickness of 0 to 500 Å. The first p-type guide layer 171 may be composed of a p-type AlGaN.

Figure 9:
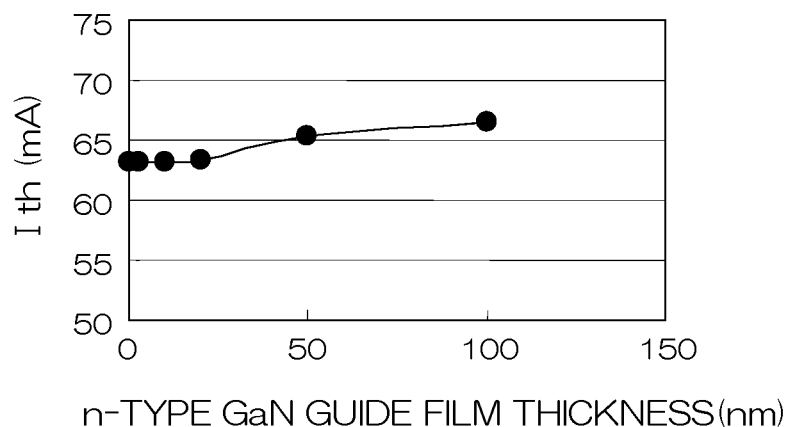
FIG. 9 shows an obtained relationship between the thickness of a second n-type guide layer and the emission threshold value.

FIG. 9 shows an obtained relationship between the thickness of the second n-type guide layer 152 and the emission threshold value (Ith), showing a calculation result when the second n-type guide layer 152 is composed of an n-type GaN layer. FIG. 9 shows that the threshold value is sufficiently low as long as the second n-type guide layer 152 has a thickness of 500 Å or less, not having a substantial impact on the device characteristics. Further, the threshold value is saturated around a lower limit if the second n-type guide layer 152 has a thickness of 200 Å or less. Since the refractive index of GaN is 2.5, the threshold value can be saturated around a lower limit if the second n-type GaN layer 152 has an optical film thickness of 500 Å (=200 Å×2.5) or less.

Figure 10:
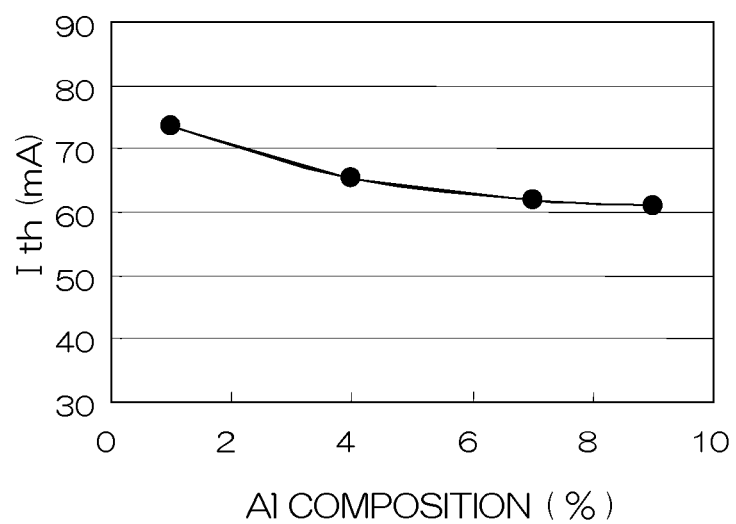
FIG. 10 shows an obtained relationship between the Al composition of an n-type clad layer and the emission threshold value.

FIG. 10 shows an obtained relationship between the Al composition (average Al composition) of the n-type clad layer 14 and the emission threshold value (Ith), where the n-type clad layer 14 has a thickness of 10000 Å. FIG. 10 shows that the higher the Al composition is, the lower the threshold value becomes. However, if the average Al composition is 9% or higher, a large lattice mismatch with the GaN substrate 1 occurs and thereby cracks may occur on the entire surface of the nitride semiconductor laminate structure 2. Also, an Al composition of 4% or lower results in a high rate of increase in the threshold value. Therefore, the n-type clad layer 14 appropriately has an average Al composition of 4% to 9%.

Figure 11:
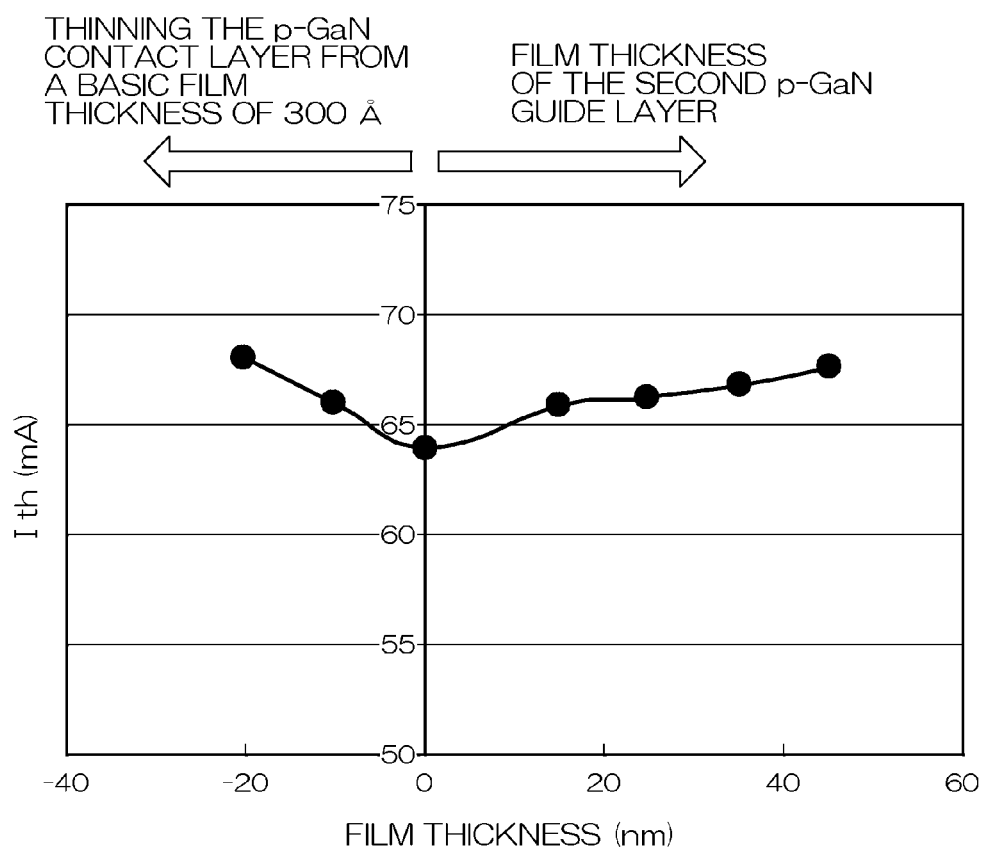
FIG. 11 shows a calculated relationship between the thickness of a p-type GaN contact layer and a second p-type GaN guide layer and the threshold current.

FIG. 11 shows a calculated relationship between the thickness of the p-type GaN contact layer and the second p-type GaN guide layer and the threshold current. The calculation of the threshold current of the semiconductor laser device 101 while thinning the p-type GaN contact layer 173 from a basic thickness of 30 nm finds that the threshold current increases with a reduction in the thickness. That is, the p-type GaN contact layer 173 is required to have a certain thickness to confine light. Meanwhile, the calculation of the threshold current of the semiconductor laser device 101 while thickening the second p-type GaN guide layer 172 from 0 nm finds that the threshold current increases with an increase in the thickness. Therefore, the threshold current can be reduced by reducing the thickness of the second p-type GaN guide layer 172 as thin as possible to bring the insulating film 4 closer to the light emitting layer 10 and thereby enhance transverse light confinement. Specifically, the second p-type guide layer 172 preferably has a thickness of 50 nm or small, whereby the threshold current can be sufficiently low.

As described heretofore, the semiconductor laser device 101 includes no p-type semiconductor clad layer. That is, the nitride semiconductor laminate structure 2 includes no p-type semiconductor clad layer. If the nitride semiconductor laminate structure 2 includes a p-type semiconductor clad layer, the light emitting layer 10 is to be formed at a relatively low temperature and thereafter the p-type semiconductor clad layer is to be formed at a temperature higher than that where the light emitting layer 10 is formed in the process of forming the nitride semiconductor laminate structure 2. This may result in that the light emitting layer 10 is thermally damaged during the formation of the p-type semiconductor clad layer. Whereas, this preferred embodiment, in which the nitride semiconductor laminate structure 2 includes no p-type semiconductor clad layer, can prevent a thermal damage to the light emitting layer 10 in the process of forming the nitride semiconductor laminate structure 2. In addition, providing such a p-type semiconductor clad layer containing Al causes the p-type semiconductor clad layer itself to work as a high-resistance layer. Whereas, this preferred embodiment, which does not require such a p-type semiconductor clad layer, can reduce the electric resistance effectively. Thus, a good emission efficiency and low threshold value can be achieved with a simple structure.

The transparent electrode 5 is required to have a certain thickness to confine light from the light emitting layer 10 with the n-type clad layer 14. However, since the first conductive film. 21, which is composed of an indium oxide-based material, has a low film formation rate, it takes time to grow the transparent electrode 5, if composed only of the first conductive film 21. On the other hand, the second conductive film 22, which is composed of a zinc oxide-based, gallium oxide-based, or tin oxide-based material, has a relatively high film formation rate, but a high contact resistance with p-type nitride semiconductors. Hence, in the present preferred embodiment, the portion of the transparent electrode 5 in contact with the p-type semiconductor layer 12 is formed by the first conductive film. 21, which is composed of an indium oxide-based material, to reduce contact resistance. In particular, the first conductive film 21, which is composed of ITO, can have a sufficiently reduced contact resistance with the p-type semiconductor layer 12. Meanwhile, the transparent electrode 5 includes the first conductive film 21 and the second conductive film 22, which is composed of a zinc oxide-based, gallium oxide-based, or tin oxide-based material and laminated on the first conductive film 21, to increase the rate of growth of the transparent electrode 5. More specifically, it is possible to shorten the time required for the formation of the transparent electrode 5 and thereby improve the productivity by forming the first conductive film 21 at a minimum film thickness.

Further, the p-type guide layers 171 and 172 and the p-type contact layer 173, which are composed of GaN, can be formed at a lower temperature relative to the case of a composition containing Al. This can further reduce thermal damage to the light emitting layer 10.

Also, the insulating film 4 insulates the p-type semiconductor layer 12 from the transparent electrode 5 within the region excluding the opening portion 20. The insulating film 4 can provide current confinement within the opening portion 20 to contribute to light confinement in the light emitting layer 10 together with the transparent electrode 5 serving as an upper clad layer.

The transparent electrode 5 supplies a current to the p-type semiconductor layer 12. The transparent electrode 5 enters the opening portion 20 of the insulating film 4 to be in contact with the p-type semiconductor layer 12. This can limit the electrical connection between the transparent electrode 5 and the p-type semiconductor layer 12 within the opening portion 20 to form a current confinement structure.

The transparent electrode 5 is arranged by laminating the first conductive film 21, which is composed of an indium oxide-based material, and the second conductive film 22, which is composed of a zinc oxide-based, gallium oxide-based, or tin oxide-based material, as mentioned above. The thus arranged transparent electrode 5 has a lower refractive index relative to group III nitride semiconductors. For this reason, the light confinement structure, if constituted by the n-type group III nitride semiconductor clad layer and the transparent electrode 5, makes the light emission peak (electric field strength peak) more likely to shift to the n-type semiconductor layer 11 rather than to the light emitting layer 10. In particular, the InGaN quantum well layer 51 included in the light emitting layer 10 is required to have a low In composition (e.g. approximately 6%) to generate blue-violet light with a wavelength of 400 nm to 410 nm. This makes it impossible to increase the refractive index of the light emitting layer 10 and thereby difficult to fit the light emission peak to the light emitting layer 10. It is thus difficult to achieve a semiconductor laser device having adequate characteristics (e.g. sufficiently low threshold value).

Hence, in this preferred embodiment, the n-type guide layer 15 includes the first n-type guide layer 151 composed of a superlattice layer in which an InGaN layer 61 and a GaN layer 62 are laminated alternately and periodically, and the superlattice layer has an average refractive index of 2.6 or lower. More specifically, the In composition and film thickness of the InGaN layer 61 is designed so that the superlattice layer has an average refractive index of 2.6 or lower. Then, the superlattice layer is disposed in contact with the light emitting layer 10. This allows the refractive index of p- and n-types on either side of the light emitting layer 10 to be balanced for blue-violet light with a wavelength of 400 nm to 410 nm and thereby the light emission peak to be fitted to the light emitting layer 10, whereby it is possible to provide a semiconductor laser device 101 having adequate characteristics (especially, sufficiently low threshold value).

In addition, the first n-type guide layer 151, which is composed of a superlattice layer, is less likely to undergo large threading dislocation that may be carried from the GaN substrate 1. This can suppress or prevent current leakage due to threading dislocation.

The InGaN layer 61 included in the superlattice layer of the first n-type guide layer 151, if having a high In composition, may have a refractive index higher than that of the light emitting layer 10, and further may result in poor carrier confinement in the light emitting layer 10. Hence, the In composition of the InGaN layer 61 included in the superlattice layer is lower than the In composition of the InGaN quantum well layer 51 in the light emitting layer 10.

Also, in this preferred embodiment, the InGaN layer 61 included in the superlattice layer of the first n-type guide layer 151 is in contact with the barrier layer 52 included in the quantum well structure of the light emitting layer 10. This allows the first n-type guide layer 151, which has a low refractive index, to be disposed in contact with the light emitting layer 10, whereby the light emission peak can be fitted to the light emitting layer 10.

Further, in this preferred embodiment, the p-type electron blocking layer 16 is composed of an AlGaN layer with an Al composition of 15% to 25%. This can bring the light emission peak closer to the light emitting layer 10 and thereby achieve adequate laser diode characteristics (especially, sufficiently low threshold value). Also, in this preferred embodiment, the p-type electron blocking layer 16 has an optical film thickness of 300 Å or less. With this arrangement, the thickness of the p-type electron blocking layer 16, which has a low refractive index, can be suppressed, whereby the light emission peak can be fitted to the light emitting layer 10.

Further, in this preferred embodiment, the p-type semiconductor layer 12 includes the first p-type guide layer 171, which is composed of $Al_{x1}Ga_{1-x1}N$ ($0 \leq X1 < 1$), disposed between the p-type electron blocking layer 16 and the light emitting layer 10. The growth temperature (e.g. 1050° C.) of the p-type AlGaN electron blocking layer 16 is higher than the growth temperature (e.g. 850° C.) of the light emitting layer 10 including the InGaN quantum well layer 61. Therefore, in the process of manufacturing the semiconductor laser device 101, the p-type AlGaN electron blocking layer 16 is required to be grown after the growth of the light emitting layer 10 and then wait for the rise in the temperature of the substrate. During this waiting period, the topmost surface (crystal surface) of the light emitting layer 10 is exposed to impurities in the atmosphere, which may cause the crystal surface to be deteriorated. Hence, in this preferred embodiment, the first p-type guide layer 171, which is composed of $Al_{x1}Ga_{1-x1}N$ ($0 \leq X1 < 1$), is disposed between the light emitting layer 10 and the p-type electron blocking layer 16. The crystal growth can occur continuously from the light emitting layer 10 to the p-type electron blocking layer 16 by forming the first p-type guide layer 171 during the temperature rise process after the growth of the light emitting layer 10 and continuously forming the p-type AlGaN electron blocking layer 16. This can prevent the surface of the light emitting layer 10 from being deteriorated and thereby can improve the characteristics (especially, threshold value) of the semiconductor laser device 101.

Furthermore, in this preferred embodiment, the n-type guide layer 15 includes the first n-type guide layer 151, which is composed of a superlattice layer in which an InGaN layer 61 and a GaN layer 62 are laminated alternately and periodically, and the second guide layer 152, which is composed of an $In_{x2}Ga_{1-x2}N$ layer ($0 \leq X2 < 1$) and disposed between the first n-type guide layer 151 and the n-type clad layer 14. The n-type clad layer 14 and the first n-type guide layer 151 have their respective different compositions and therefore different crystal growth temperatures. That is, the growth temperature (e.g. 850° C.) of the first n-type guide layer 151, which is composed of an InGaN/GaN superlattice layer, is lower than the growth temperature (e.g. 1050° C.) of the n-type AlGaN clad layer 14. Therefore, in the process of manufacturing the semiconductor laser device 101, the first n-type guide layer 151 is required to be grown after the growth of the n-type clad layer 14 and then wait for the fall in the temperature of the substrate. During this waiting period, the topmost surface (crystal surface) of the n-type clad layer 14 is exposed to impurities in the atmosphere, which may cause the crystal surface to be deteriorated (especially, Al oxidization). Hence, in this preferred embodiment, the second n-type guide layer 152, which is composed of an $In_{x2}Ga_{1-x2}N$ layer ($0 \leq X2 < 1$), is disposed between the first n-type guide layer 151 and the n-type clad layer 14. The crystal growth can occur continuously from the n-type clad layer 14 to the first n-type guide layer 151 by forming the second n-type guide layer 152 during the temperature fall process after the growth of the n-type clad layer 14 and continuously forming the first n-type guide layer 151 (superlattice layer). This can prevent the surface of the n-type clad layer 14 from being deteriorated and thereby can improve the characteristics (especially, threshold value) of the semiconductor laser device 101.

Continuing the crystal growth during the temperature fall process after the growth of the n-type clad layer 14 to form the second n-type guide layer 152 results in that the second n-type guide layer 152 has a gradient In composition in the thickness direction. The average In composition of the first n-type guide layer 151 is therefore different from the average In composition of the second n-type guide layer 152. Specifically, the average In composition of the first n-type guide layer 151 is higher than the average In composition of the second n-type guide layer 152. This allows the second n-type guide layer 152 to have a refractive index lower than that of the first n-type guide layer 151 and thereby the light emission peak to be prevented from shifting to the n-side.

Moreover, in this preferred embodiment, the n-type AlGaN clad layer 14 has an Al composition of higher than 4% but lower than 9%. This allows the light emission peak to be fitted to the light emitting layer 10 and the semiconductor laser device 101 to have a low threshold value without crack generation on the nitride semiconductor laminate structure 2. Also, in this preferred embodiment, the n-type clad layer 14 is composed of a superlattice layer in which an $Al_{x3}Ga_{1-x3}N$ layer 71 ($0 < X3 < 1$) and an $Al_{x4}Ga_{1-x4}N$ layer 72 ($0 < X4 < X3$) are laminated alternately and periodically. This allows the n-type clad layer 14 to have a high average Al composition and to be thickened (e.g. 1 μm to 1.5 μm) without crack generation, and thereby the light emission peak to be fitted to the light emitting layer 10 with no yield reduction.

Further, in the semiconductor laser device 101 according to this preferred embodiment, the p-type contact layer 173 has a high p-type impurity concentration and therefore a reduced contact resistance with the transparent electrode 5. The second p-type guide layer 172 has a p-type impurity concentration lower than that of the p-type contact layer 173, and further the first p-type guide layer 171 has a p-type impurity concentration lower than that of the second p-type guide layer 172. That is, the closer the light emitting layer 10 is, the lower the p-type impurity concentration becomes, whereby light absorption by impurities can be suppressed.

The p-type contact layer 173 also forms a stripe-like ridge portion, that is, a current confinement structure whereby current is concentrated on the ridge portion. Then, the insulating films 4 are arranged on either side of the ridge portion. This causes the insulating films 4 to be arranged closer to the light emitting layer 10 to enhance transverse light confinement, while ensuring a certain thickness of the p-type semiconductor layer 12 including the p-type contact layer 173 to confine light also in the longitudinal direction, whereby the emission threshold value can be reduced. In particular, reducing the thickness of the second p-type guide layer 172 to 50 nm or less allows the insulating films 4 on either side of the ridge portion to be made more closer to the light emitting layer 10. This can further enhance the transverse light confinement to contribute to the reduction in the emission threshold value.

Figure 12:
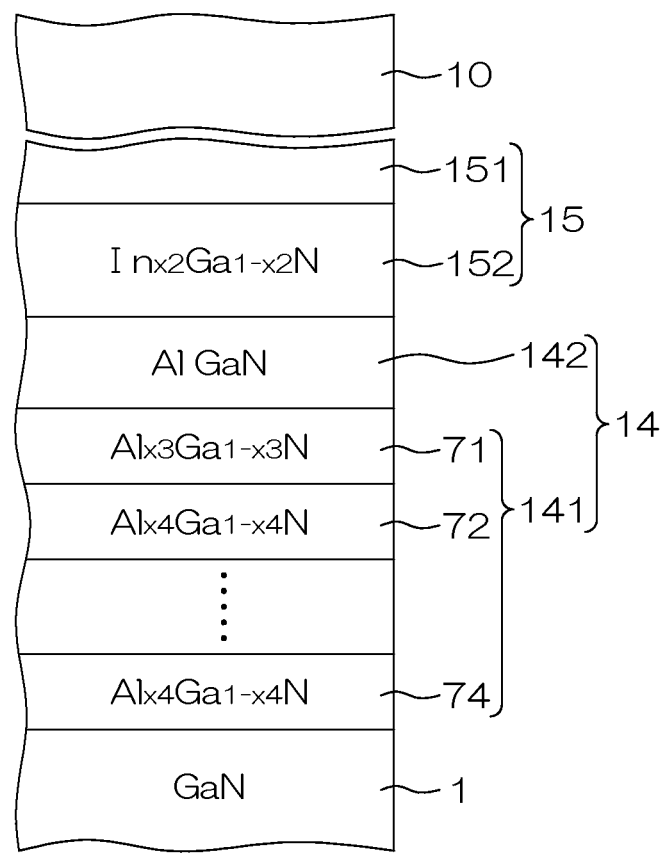
FIG. 12 is a schematic partial cross-sectional view illustrating an arrangement of a semiconductor laser device according to another preferred embodiment of the present invention.

FIG. 12 is a schematic partial cross-sectional view illustrating an arrangement of a semiconductor laser device 102 according to another preferred embodiment of the present invention. In FIG. 12, portions corresponding to those shown in FIG. 2A are designated by the same reference signs. In this preferred embodiment, the n-type clad layer 14 includes a superlattice layer 141 in which an $Al_{x3}Ga_{1-x3}N$ layer 71 ($0 < X3 < 1$) and an $Al_{x4}Ga_{1-x4}N$ layer 72 ($0 < X4 < X3$) are laminated periodically and an AlGaN layer 142 other than the superlattice layer 141. The AlGaN layer 142 is disposed closer to the light emitting layer 10 than the superlattice layer 141. Then, the average Al composition of the superlattice layer 141 is higher than the average Al composition of the AlGaN layer 142. Since the superlattice layer 141 has a higher average Al composition and therefore a lower refractive index, disposing the superlattice layer farther from the light emitting layer 10 makes it easy to fit the light emission peak to the light emitting layer 10.

Figure 13:
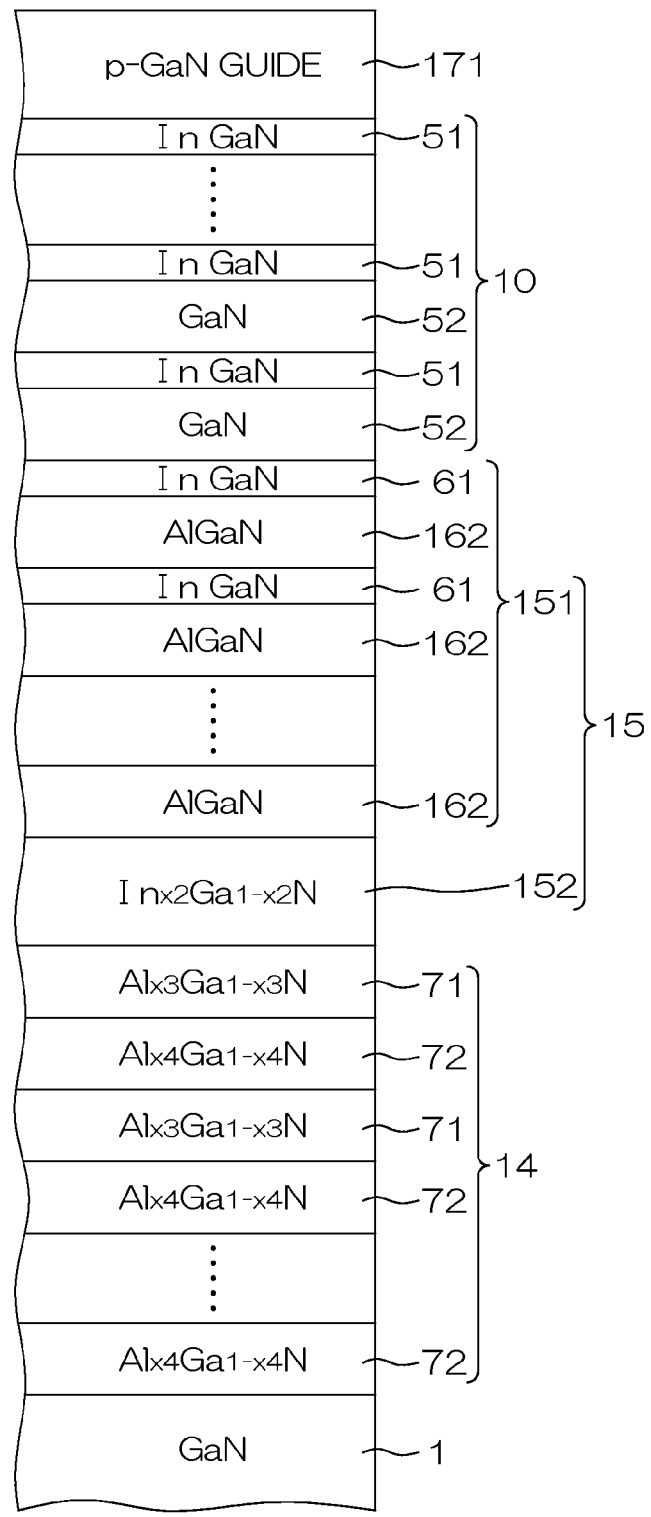
FIG. 13 is a schematic cross-sectional view illustrating an arrangement of a semiconductor laser device according to still another preferred embodiment of the present invention.

FIG. 13 is a schematic cross-sectional view illustrating an arrangement of a semiconductor laser device 103 according to still another preferred embodiment of the present invention. In FIG. 13, portions corresponding to those shown in FIG. 2A are designated by the same reference signs. In this preferred embodiment, the first n-type guide layer 151 is composed of a superlattice layer in which an InGaN layer 61 and an $Al_xGa_{1-x}N$ layer 162 ($0<X\leq 0.04$) are laminated periodically. More specifically, the superlattice structure is formed by alternately laminating the $Al_xGa_{1-x}N$ layer 162 and the InGaN layer 61 in the order of $Al_xGa_{1-x}N$ layer 162, InGaN layer 61, $Al_xGa_{1-x}N$ layer 162, . . . from the GaN substrate 1. The first n-type guide layer 151 has an average refractive index of 2.6 or lower. The InGaN layer 61 included in the superlattice layer has an In composition of, for example, 6% or lower (more preferably 4% or lower), being lower than the In composition of the InGaN quantum well layer 51 included in the light emitting layer 10. The $Al_xGa_{1-x}N$ layer 162 has an Al composition X of 0 to 0.04 (4%). The InGaN layer 61 included in the first n-type guide layer 151 (superlattice layer) is in contact with the barrier layer 52 in the light emitting layer 10. The first n-type guide layer 151 also has an optical film thickness of 1000 Å or more but 4000 Å or less.

The average refractive index of the first n-type guide layer 151 is given by the following formula using the refractive index $n_{InGaN}$ and film thickness $T_{InGaN}$ of the InGaN layer 61 and the refractive index $n_{AlGaN}$ and film thickness $T_{AlGaN}$ of the $Al_xGa_{1-x}N$ layer 162 included in the superlattice layer. In this formula, the denominator represents layer thickness per period (periodic thickness) and the numerator represents optical film thickness per period.

$$\text{Average refractive index} = \frac{n_{InGaN} \times T_{InGaN} + n_{AlGaN} \times T_{AlGaN}}{T_{InGaN} + T_{AlGaN}}$$

The optical film thickness of the superlattice layer included in the first n-type guide layer 151 is given by the following formula using the number N of repetitive periods in the superlattice layer (i.e. the number of pairs of InGaN layer 61 and $Al_xGa_{1-x}N$ layer 162).

Optical film thickness=$(n_{InGaN} \cdot T_{InGaN} + n_{AlGaN} \cdot T_{AlGaN}) \times N$ The second n-type guide layer 152 is composed of an $In_{x2}Ga_{1-x2}N$ layer ($0 \leq X2 < 1$; GaN layer if X2=0). The average In composition of the first n-type guide layer 151 is different from the average In composition of the second n-type guide layer 152. Specifically, the average In composition of the first n-type guide layer 151 is higher than the average In composition of the second n-type guide layer 152. More specifically, the average In composition of the second n-type guide layer 152 is lower than the In composition of the InGaN layer 61 included in the superlattice layer of the first n-type guide layer 151. The second n-type guide layer 152 is also composed of a single undoped $In_{x2}Ga_{1-x2}N$ film having a gradient In composition X2 in the thickness direction. The second n-type guide layer 152 preferably has an optical film thickness of 500 Å or less. The optical film thickness in this case is given by the product of the refractive index and the film thickness of the second n-type guide layer 152.

Figure 14:
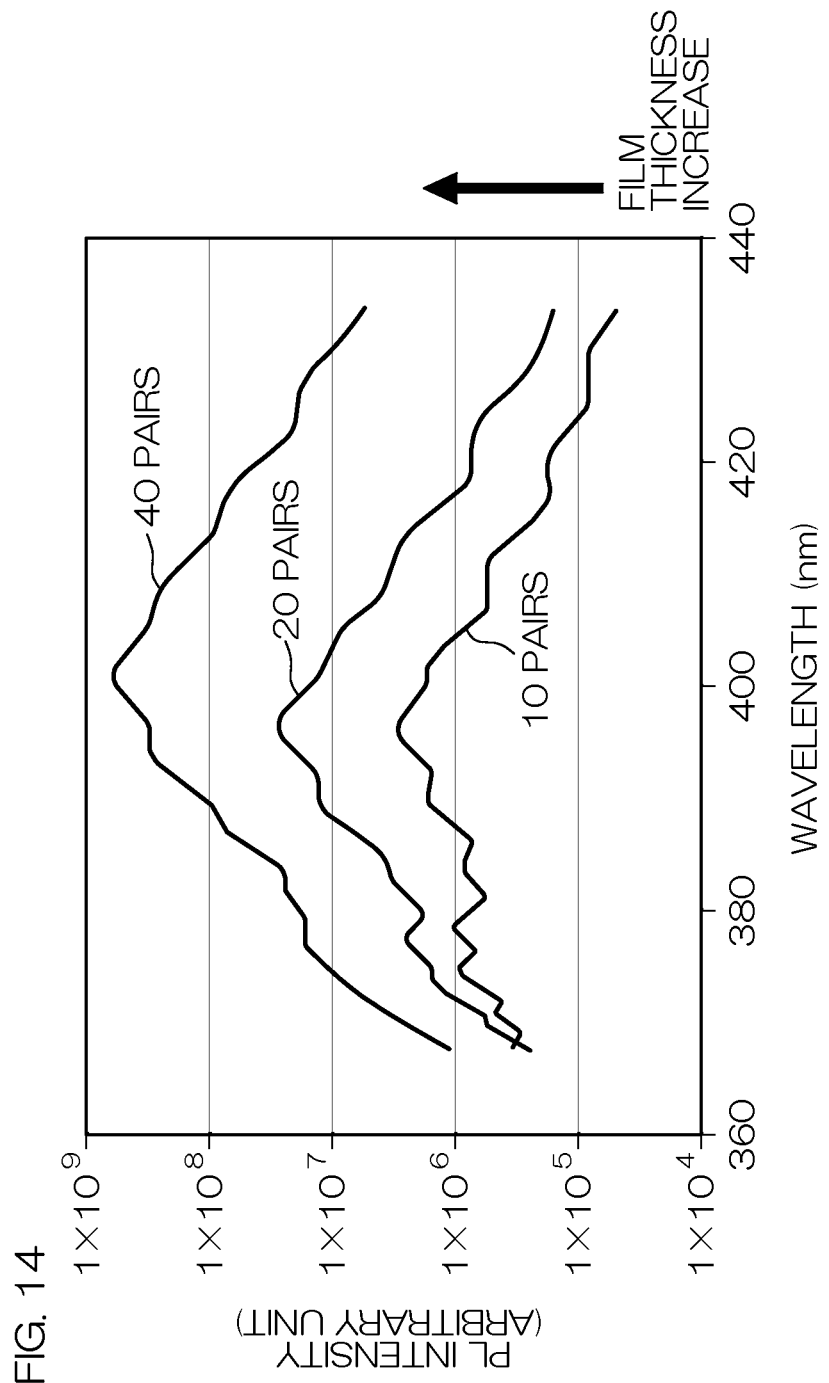
FIG. 14 shows an experimentally obtained relationship between the physical film thickness (absolute film thickness) of the first n-type guide layer and the photoluminescence (PL) intensity for the structure shown in FIG. 2A.

FIG. 14 shows an experimentally obtained relationship between the physical film thickness $(T_{InGaN}+T_{GaN}) \times N$ (absolute film thickness) of the first n-type guide layer 151 and the photoluminescence (PL) intensity for the structure according to the above-described first preferred embodiment. Specifically, there are shown spectrums obtained for three samples with the number of pairs N set, respectively, to 10, 20, and 40. This experimental result shows that doubling the number of pairs, that is, doubling the absolute film thickness results in one digit higher light emission intensity. That is, the first n-type guide layer 151 advantageously has a certain level of large absolute film thickness to increase the light emission intensity to achieve a high-intensity semiconductor laser device.

For example, if the superlattice included in the first n-type guide layer 151 has a periodic thickness of 40 Å and the number of pairs N=40, the first n-type guide layer 151 has an absolute film thickness of 1600 Å. In this case, the first n-type guide layer 151 is required to have an average refractive index of 2.5 (=4000/1600) to have an optical film thickness of 4000 Å. However, since the refractive index of GaN is 2.53, such an InGaN/GaN superlattice layer as described in the first preferred embodiment cannot form the first n-type guide layer 151 with an average refractive index of 2.5 under the restriction that the optical film thickness be 4000 Å or less.

Hence, in this preferred embodiment, the first n-type guide layer 151 is composed of a superlattice layer in which an InGaN layer 61 and an $Al_xGa_{1-x}N$ layer 162 ($0<X\leq 0.04$) are laminated periodically. The refractive index of $Al_xGa_{1-x}N$ ($0<X\leq 0.04$) is lower than that of GaN. For example, the refractive index of $Al_{0.03}Ga_{0.97}N$ with an Al composition X of 0.03 (3%) is 2.50. Thus, the first n-type guide layer 151 with a large absolute film thickness can be formed under the restriction that the optical film thickness be 4000 Å or less by composing the first n-type guide layer 151 of a superlattice layer including an InGaN layer 61 and an $Al_xGa_{1-x}N$ layer 162 ($0<X\leq 0.04$), whereby a higher-intensity semiconductor laser device can be achieved.

If the first n-type guide layer 151 has an optical film thickness of 1000 Å to 4000 Å and an average refractive index of 2.6 or lower, the absolute film thickness of the first n-type guide layer 151, which is composed of an InGaN/GaN superlattice layer, has a lower limit of 385 Å (=1000/2.6) and an upper limit of 1581 Å (=4000/2.53). On the other hand, the absolute film thickness of the first n-type guide layer 151, which is composed of an $InGaN/Al_{0.03}Ga_{0.97}N$ superlattice layer, has a lower limit of 385 Å (=1000/2.6) and an upper limit of 1600 Å (=4000/2.5). Thus, using the $Al_xGa_{1-x}N$ layer 162 ($0<X\leq 0.04$) allows the range of the absolute film thickness to be widened, so that the degree of freedom of the design increases. Specifically, increasing the absolute film thickness and therefore the light emission intensity as mentioned above can achieve a high-intensity semiconductor laser device.

FIG. 15 illustrates an exemplary arrangement of a superlattice constituting the first n-type guide layer 151. This figure shows exemplary combinations of the film thickness of the InGaN layer 61 and the $Al_xGa_{1-x}N$ layer 162 ($0 \leq X \leq 0.04$) included in the superlattice layer of the first n-type guide layer 151. However, in this case, the superlattice layer is designed so that the periodic thickness is 40 Å and the first n-type guide layer 151 has an average refractive index of 2.54, and the InGaN layer 61 has an In composition of 2.4%. Further, the number of superlattice pairs N is 39, the absolute film thickness is 1560 Å (=40 Å×39), and the optical film thickness is 3962.4 Å (=1560 Å×2.54). The average refractive index of 2.54 can be achieved by thickening the InGaN layer and thinning the $Al_xGa_{1-x}N$ layer as the Al composition X of the $Al_xGa_{1-x}N$ layer increases. If the Al composition X of the $Al_xGa_{1-x}N$ layer is zero, the arrangement corresponds to that in the above-described first preferred embodiment.

Figure 16:
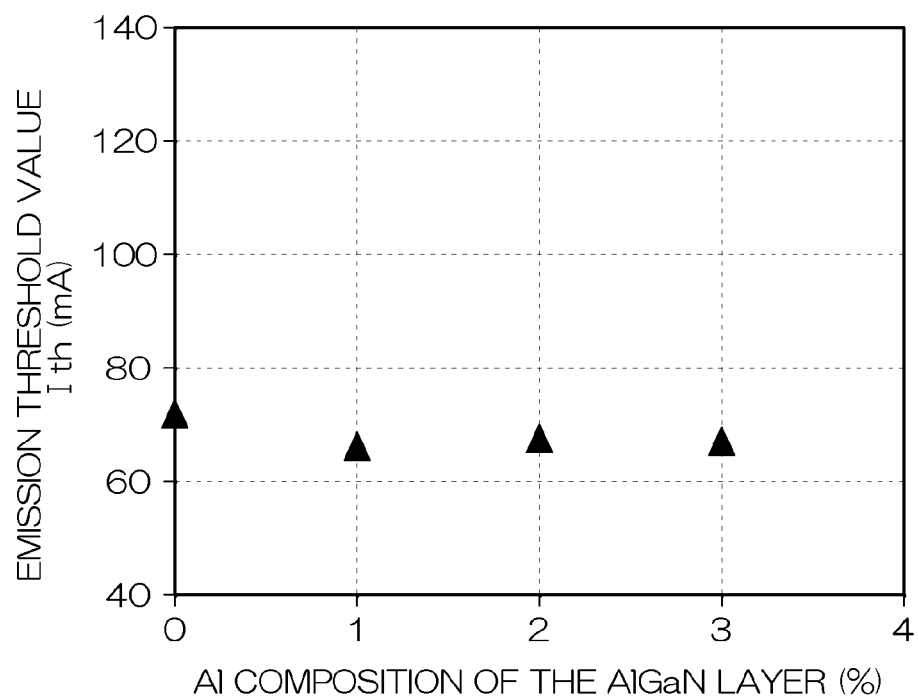
FIG. 16 shows emission threshold values of the semiconductor laser device in which the first n-type guide layer is composed of each superlattice layer combination shown in FIG. 15.

FIG. 16 shows emission threshold values (Ith) of the semiconductor laser device in which the first n-type guide layer 151 is composed of each superlattice layer combination shown in FIG. 15. No correlation is shown between the Al composition and the threshold value, which therefore finds that using an $Al_xGa_{1-x}N$ layer (0<X) cannot have a negative impact on the characteristics of the semiconductor laser device. That is, using an $Al_xGa_{1-x}N$ layer (0<X) allows the absolute film thickness of the first n-type guide layer 151 and therefore the light emission intensity to be increased without sacrificing other device characteristics.

Although the three preferred embodiments of the present invention have heretofore been described, the invention may be embodied in further specific forms. For example, the thickness, impurity concentration, etc., of each layer and film constituting the nitride semiconductor laminate structure 2 and the transparent electrode 5 are merely illustrative, and appropriate values may be used selectively. Also, the n-type clad layer 14 may not necessarily be composed of a single AlGaN layer, but may be composed of a superlattice layer including an AlGaN layer and a GaN layer.

Further, the p-type contact layer 173 described in the preferred embodiments above may be omitted so that the p-type semiconductor layer 12 has no ridge portion.

Also, the second n-type guide layer 152 described in the preferred embodiments above may be omitted. Similarly, the first p-type GaN guide layer 171 described in the preferred embodiments above may be omitted.

Although AlGaN and GaN, etc., are exemplified as a nitride semiconductor in the preferred embodiments above, other types of nitride semiconductors such as aluminum nitride (AlN) and indium nitride (InN) may be used. Nitride semiconductors can generally be represented as $Al_xIn_yGa_{1-x-y}N$ (0≤x≤1, 0≤y≤1, 0≤x+y≤1).

Further, the first conductive film 21 may not entirely cover the surface of the insulating film 4 outside the opening portion 20, but may satisfactorily cover at least the surface of the p-type semiconductor layer 12 exposed through the opening portion 20 and the surface of the insulating film 4 within the region of approximately 50 μm from the both sides of the opening portion 20.

Furthermore, the substrate 1 may be removed by, for example, laser lift-off after the arrangement of the nitride semiconductor laminate structure 2 to provide a semiconductor laser device without the substrate 1.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The present application corresponds to Japanese Patent Application Nos. 2011-155942 and 2012-139876 filed in the Japan Patent Office on Jul. 14, 2011, and Jun. 21, 2012, respectively. The entire disclosures of these applications are incorporated herein by reference.

What is claimed is:

1. A semiconductor laser device for generating blue-violet light with an emission wavelength of 400 nm to 410 nm, comprising:
an n-type group III nitride semiconductor layer including
an n-type clad layer, and
an n-type guide layer comprising a superlattice layer;
an active layer laminated on the n-type group III nitride semiconductor layer and having an InGaN quantum well layer;
a p-type group III nitride semiconductor layer laminated on the active layer, the p-type group III nitride semiconductor layer including
a p-type guide layer having a flat surface, and
a p-type contact layer having an impurity concentration higher than an impurity concentration of the p-type guide layer;
a transparent electrode in contact with the p-type group III nitride semiconductor layer, the transparent electrode serving as a clad; and
an insulating film disposed between the p-type guide layer and the transparent electrode, the insulating film having a flat surface and an opening penetrating through the insulating film so as to expose the flat surface of the p-type guide layer through the opening, wherein
the p-type guide layer is disposed between the active layer and the transparent electrode,
the p-type contact layer is disposed between the p-type guide layer and the transparent electrode, the p-type contact layer being in contact with the transparent electrode on one surface thereof within the opening of the insulating film and in contact with the flat surface of the p-type guide layer on the other surface thereof within the opening of the insulating film,
the n-type guide layer is disposed between the n-type clad layer and the active layer,
the superlattice layer, in which an InGaN layer and an $Al_xGa_{1-x}N$ layer (0≤X<1) are laminated periodically, is in contact with the active layer, the superlattice layer having an average refractive index of 2.6 or lower,
the In composition of the InGaN layer is lower than the In composition of the InGaN quantum well layer, and
the transparent electrode includes
a first conductive film in ohmic contact with the p-type contact layer, the first conductive film containing an indium oxide-based material, and
a second conductive film laminated on the first conductive film and having a thickness greater than a thickness of the first conductive film, the second conductive film containing a zinc oxide-based, gallium oxide-based or tin oxide-based material.

2. The semiconductor laser device according to claim 1, wherein the indium oxide-based material contains Sn at a composition of 3% or higher.

3. The semiconductor laser device according to claim 1, wherein the second conductive film contains $Mg_xZn_{1-x}O$ (0≤X<1).

4. The semiconductor laser device according to claim 3, wherein the Mg composition x is 0.5 or lower.

5. The semiconductor laser device according to claim 1, wherein the n-type guide layer has an optical film thickness of 1000 Å or more but 4000 Å or less.

6. The semiconductor laser device according to claim 1, wherein the InGaN layer included in the superlattice layer has an In composition of 6% or lower.

7. The semiconductor laser device according to claim 1, wherein the InGaN layer included in the superlattice layer has an In composition of 4% or lower.

8. The semiconductor laser device according to claim 1, wherein the Al composition X of the $Al_xGa_{1-x}N$ layer included in the superlattice layer is zero.

9. The semiconductor laser device according to claim 1, wherein the Al composition X of the $Al_xGa_{1-x}N$ layer included in the superlattice layer is $0<X\leq 0.04$.

10. The semiconductor laser device according to claim 1, wherein
the active layer has a multiple-quantum well structure in which an undoped InGaN or GaN barrier layer and the InGaN quantum well layer are laminated alternately, and
the InGaN layer included in the superlattice layer is in contact with the barrier layer.

11. A semiconductor laser device for generating blue-violet light with an emission wavelength of 400 nm to 410 nm, comprising:
an n-type group III nitride semiconductor layer;
an active layer laminated on the n-type group III nitride semiconductor layer and having an InGaN quantum well layer;
a p-type group III nitride semiconductor layer laminated on the active layer, the p-type group III nitride semiconductor layer including
a p-type guide layer having a flat surface,
a p-type contact layer having an impurity concentration high than an impurity concentration of the p-type guide layer, and
a p-type AlGaN electron blocking layer;
a transparent electrode in contact with the p-type group III nitride semiconductor layer, the transparent electrode serving as a clad;
an insulating film disposed between the p-type guide layer and the transparent electrode, the insulating film having a flat surface and an opening penetrating through the insulating film so as to expose the flat surface of the p-type guide layer through the opening, wherein
the p-type guide layer is disposed between the active layer and the transparent electrode,
the p-type contact layer is disposed between the p-type guide layer and the transparent electrode, the p-type contact layer being in contact with the transparent electrode on one surface thereof within the opening of the insulating film and in contact with the p-type guide layer on the other surface thereof within the opening of the insulating film,
the p-type AlGaN electron blocking layer having an Al composition of 15% or higher but 25% or lower, and
the transparent electrode includes
a first conductive film in ohmic contact with the p-type contact layer, the first conductive film containing an indium oxide-based material, and
a second conductive film laminated on the first conductive film and having a thickness greater than a thickness of the first conductive film, the second conductive film containing a zinc oxide-based gallium oxide-based or tin oxide-based material.

12. The semiconductor laser device according to claim 11, wherein the p-type electron blocking layer has an optical film thickness of 300 Å or less.

13. The semiconductor laser device according to claim 11, wherein the p-type group III nitride semiconductor layer further includes an additional p-type guide layer disposed between the p-type electron blocking layer and the active layer, the additional p-type guide layer being composed of $Al_{x1}Ga_{1-x}N$ ($0\leq X1<1$).

14. The semiconductor laser device according to claim 13, wherein the additional p-type guide layer has a thickness of 0 to 500 Å.

15. A semiconductor laser device for generating blue-violet light with an emission wavelength of 400 nm to 410 nm, comprising:
an n-type group III nitride semiconductor layer including
an n-type clad layer, and
an n-type guide layer;
an active layer laminated on the n-type group III nitride semiconductor layer and having an InGaN quantum well layer;
a p-type group III nitride semiconductor layer laminated on the active layer, the p-type group III nitride semiconductor layer including
a p-type guide layer having a flat surface, and
a p-type contact layer having an impurity concentration higher than an impurity concentration of the p-type guide layer;
a transparent electrode in contact with the p-type group III nitride semiconductor layer, the transparent electrode serving as a clad; and
an insulating film disposed between the p-type guide layer and the transparent electrode, the insulating film having a flat surface and an opening penetrating through the insulating film so as to expose the flat surface of the p-type guide layer through the opening, wherein
the p-type guide layer is disposed between the active layer and the transparent electrode,
the p-type contact layer is disposed between the p-type guide layer and the transparent electrode, the p-type contact layer being in contact with the transparent electrode on one surface thereof within the opening of the insulating film and in contact with the p-type guide layer on the other surface thereof within the opening of the insulating film,
the n-type guide layer is disposed between the n-type clad layer and the active layer, and the n-type clad layer is composed of AlGaN and has an Al composition of higher than 4% but lower than 9%, and
the transparent electrode includes
a first conductive film in ohmic contact with the p-type contact layer, the first conductive film containing an indium oxide-based material, and
a second conductive film laminated on the first conductive film and having a thickness greater than a thickness of the first conductive film, the second conductive film containing a zinc oxide-based, gallium oxide-based or tin oxide-based material.

16. The semiconductor laser device according to claim 15, wherein the n-type clad layer includes a superlattice layer in which an $Al_{x3}Ga_{1-x3}N$ layer ($0<X3<1$) and an $Al_{x4}Ga_{1-x4}N$ layer ($0<X4<X3$) are laminated periodically and the superlattice layer has an average Al composition of higher than 4% but lower than 9%.

17. The semiconductor laser device according to claim 16, wherein the n-type clad layer is entirely composed of the superlattice layer.

18. The semiconductor laser device according to claim 16, wherein the n-type clad layer includes the superlattice layer and an AlGaN layer other than the superlattice layer.

19. The semiconductor laser device according to claim 18, wherein the AlGaN layer other than the superlattice layer is disposed closer to the active layer than the superlattice layer.

20. The semiconductor laser device according to claim 19, wherein an average Al composition of the superlattice layer is higher than an average Al composition of the AlGaN layer other than the superlattice layer.

21. The semiconductor laser device according to claim 15, wherein the n-type guide layer includes a superlattice layer in which an InGaN layer and an $Al_xGa_{1-x}N$ layer ($0 \leq X \leq 0.04$) are laminated periodically, and the n-type clad layer is in contact with the n-type guide layer on an opposite side of the active layer.

22. The semiconductor laser device according to claim 21, wherein the Al composition X of the $Al_xGa_{1-x}N$ layer included in the superlattice layer in the n-type guide layer is zero.

\* \* \* \* \*